United States Patent [19]
Nakamura et al.

[11] Patent Number: 6,141,163
[45] Date of Patent: Oct. 31, 2000

[54] PHASE-LOCKED LOOP CIRCUIT HAVING LOOP PERFORMING FEEDBACK CONTROL TO MAKE REPRODUCTION CLOCK PHASE-LOCK WITH REPRODUCTION DATA AND RECORDING/REPRODUCING APPARATUS

[75] Inventors: Norio Nakamura; Toshio Shiramatsu, both of Yokohama, Japan

[73] Assignee: Kabushiki Kaisha Toshiba, Kawasaki, Japan

[21] Appl. No.: 09/041,665

[22] Filed: Mar. 13, 1998

[30] Foreign Application Priority Data

Mar. 14, 1997 [JP] Japan ..................... 9-060709

[51] Int. Cl.[7] .............. G11B 5/09; H03D 3/24
[52] U.S. Cl. ............................. 360/51; 375/376
[58] Field of Search ................ 360/51, 46; 331/11, 331/14; 375/376; 327/147

[56] References Cited

U.S. PATENT DOCUMENTS

| | | | |
|---|---|---|---|
| 5,157,355 | 10/1992 | Shikakura et al. | 360/51 |
| 5,610,954 | 3/1997 | Miyashita et al. | 375/375 |
| 5,745,314 | 4/1998 | Ikeda et al. | 360/51 |
| 5,943,382 | 8/1999 | Li et al. | 375/376 |

*Primary Examiner*—W. Chris Kim
*Attorney, Agent, or Firm*—Oblon, Spivak, McClelland, Maier & Neustadt, P.C.

[57] ABSTRACT

A phase-locked loop circuit and recording/reproducing apparatus of this invention include a distributor (11) for receiving reproduction data to distribute and output it as n reproduction data, a phase comparator group (6) having n phase comparators for sequentially receiving the distributed reproduction data to compare the phases of the reproduction data with that of a reproduction clock, a frequency comparator (5) for receiving a reference clock and the reproduction clock to compare their frequencies, a selector (7) for receiving a switching control signal, the phase comparison result, and the frequency comparison result, and selecting either one of the phase comparison result and the frequency comparison result to output the selected one as a voltage signal, a charge pump (8) for receiving the voltage signal and converting it into a current signal to output the current signal, a loop filter (9) for receiving the current signal to output a low-frequency voltage signal, and a VCO (10) for receiving the low-frequency voltage signal to output a reproduction clock having a corresponding frequency.

2 Claims, 23 Drawing Sheets

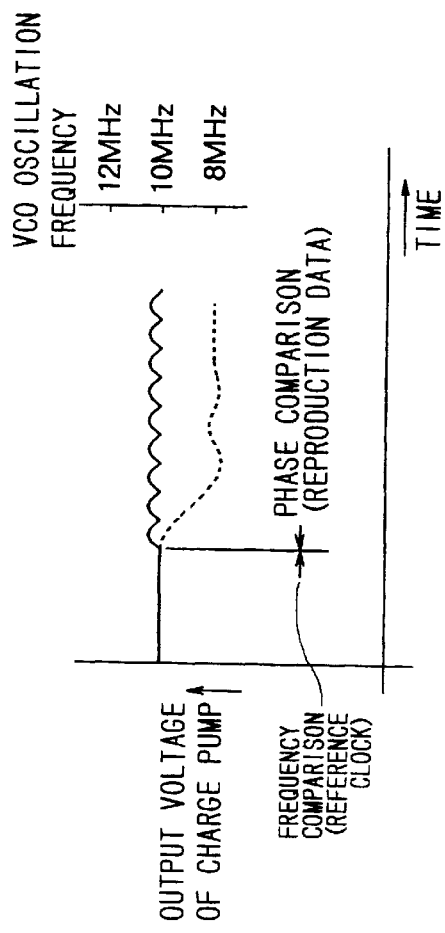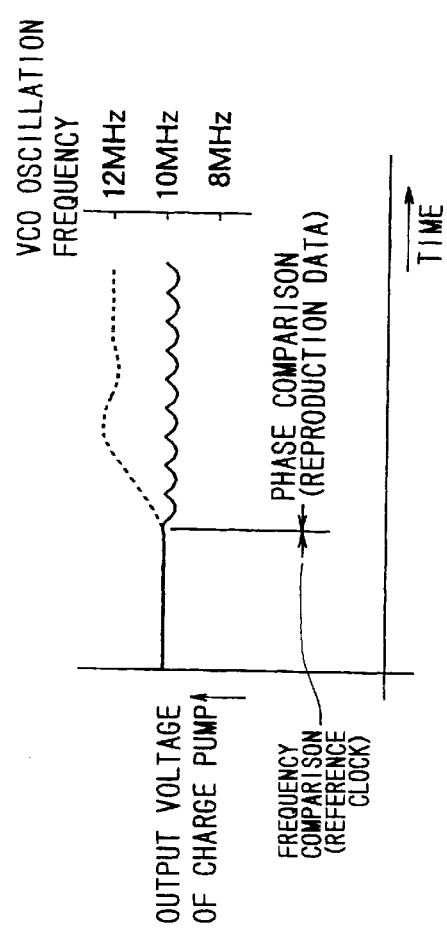

(a) ENLARGED BEAT WAVEFORM
    IN FIG. 24A
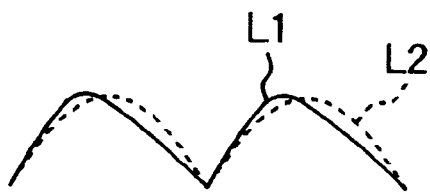
(b) ENLARGED BEAT WAVEFORM
    IN FIG. 24B
FIG. 25

6,141,163

PHASE-LOCKED LOOP CIRCUIT HAVING LOOP PERFORMING FEEDBACK CONTROL TO MAKE REPRODUCTION CLOCK PHASE-LOCK WITH REPRODUCTION DATA AND RECORDING/REPRODUCING APPARATUS

BACKGROUND OF THE INVENTION

The present invention relates to a phase-locked loop circuit, and a recording/reproducing apparatus including the phase-locked loop circuit.

Recording/reproducing apparatuses such as a magnetic recording apparatus, an optical disk apparatus, and a digital audio tape recorder (DAT) use a phase-locked loop circuit (to be referred to as a PLL hereinafter) because a clock phase-locked with reproduction data by using the reproduction data is required in reproduction. The PLL locks the phase of a clock generated upon reception of reproduction data.

In recording data on a recording medium such as a disk or a tape, data is temporarily digitally modulated and then recorded. In this modulation, a data string of m (m is an integer equal to or larger than 1) bits is generally converted into a code string of n (n is an integer larger than m) bits. Since conversion is performed with n>m, the number of types of code strings is larger than that of data strings. In this way, the number of successive "0"s is limited small in the code string. As a result, "0"s do not successively appear for a long time to allow to extract a reproduction clock from reproduction data using the PLL.

FIG. 20 shows a code string (a), a clock (f), and a recording signal (p). This code string (a) is a code string upon modulation, and is generated in synchronism with the clock (f) having a period T. The recording signal (p) is a pulse signal corresponding to the code string (a), and the pulse interval is an integer multiple of the period T. By limiting the maximum value of the pulse interval between pulse signals corresponding to many types of code strings (a) converted with n>m, pulse signals can be recorded on the recording medium at a desired pulse interval.

On the other hand, in reproducing data recorded on the recording medium, a reproduction clock equivalent to the clock (f) is required. The reproduction clock must have the same frequency and phase as those of the recording signal (p), and is generated using the PLL. However, reproduction data input to the PLL has an irregular pulse interval, as represented by the recording signal (p). To generate the reproduction clock using this pulse, an apparatus associated with the present invention comprises a PLL having two loops like the one shown in FIG. 21.

The first loop comprises an input terminal 173 for receiving reproduction data, a phase comparator 176 for comparing the phase of the reproduction data with that of a reproduction clock output from a voltage-controlled oscillator (to be referred to as a VCO hereinafter) 180, a selector 177 for selecting and outputting one of outputs from the phase comparator 176 and a frequency comparator 175, a charge pump 178 for converting the input phase comparison signal or frequency comparison signal into a corresponding current signal, a loop filter 179 operating as a low-pass filter for receiving the current signal and converting it into a low-frequency voltage signal, and the VCO 180 for outputting a signal having a frequency corresponding to the output voltage of the loop filter 179. The first loop performs feedback control so as to make the phase of the reproduction clock output from the VCO 180 phase-lock with that of the reproduction data.

The second loop comprises an input terminal 171 for receiving a reference clock, the frequency comparator 175 for comparing the frequency of the reference clock with that of the reproduction clock, the selector 177, the charge pump 178, the loop filter 179, and the VCO 180. The second loop performs feedback control so as to make the frequency of the reproduction clock output from the VCO 180 coincide with that of the reference clock.

The two loops are selected when a switching control signal is input to an input terminal 172 to switch the output of the selector 177. If both the data recording and reproducing periods exist, no reproduction data is input from the input terminal 172 during the recording period. During this period, the second loop is selected to control the output frequency of the VCO 180 so as to coincide with the frequency of the reference clock. Accordingly, even while no reproduction data is input, the reproduction clock output from the VCO 180 can be brought close to a desired frequency. When the recording period shifts to the reproducing period, and reproduction data is input, the first loop is selected, and the reproduction clock is so controlled as to phase-lock with the reproduction data.

Control using only the first loop cannot make the output from the VCO 180 phase-lock with that of the reproduction data while no reproduction data exists. In this state, even if the period shifts to the reproduction period, reproduction data is input, and phase comparison control is performed, the frequency of the output from the VCO 180 cannot be made to coincide with a single frequency of the reproduction data. At many frequencies different from the frequency of the reproduction data, the charge and discharge amounts of the capacitance in the loop filter 179 undesirably coincide with each other to falsely lock the output from the VCO 180. To avoid this phenomenon, the second loop is used during the recording period.

As shown in FIG. 22, the phase comparator 176 comprises an input terminal 191 for receiving reproduction data, an input terminal 192 for receiving the reproduction clock from the VCO 180, D flip-flops 195 to 197, an invertor 200, AND circuits 198 and 199, an output terminal 193 for outputting the phase lag amount, and an output terminal 194 for outputting the reference amount. The phase lag amount corresponds to the phase lead amount of the reproduction clock with respect to the reproduction data. When the phase of the reproduction clock is lagged from that of the reproduction data, the pulse width of the phase lag amount becomes larger than that of the reference amount; when the phase of the reproduction clock is led from that of the reproduction data, the pulse width of the phase lag amount becomes smaller than that of the reference amount; and when the two phases lock with each other, the pulse widths become equal to each other.

FIG. 23 is a timing chart showing reproduction data (b) in this case, a code string (a) corresponding to the reproduction data (b), a reproduction clock (f), outputs (q), (r), and (s) from the flip-flops 195, 196, and 197, a phase lag amount (t), and a reference amount (u). For one period T of the code string, the period of the reproduction data (b) is ½·T. The pulse widths of the phase lag amount (t) and the reference amount (u) are equal to the pulse width (¼·T) of the reproduction clock (f).

The reproduction data (f) naturally fluctuates in the time axis direction due to noise. In FIG. 23, if the reproduction data (b) fluctuates greatly over a range TV having a size of ½·T, the output phase lag amount (t) represents erroneous phase comparison information. In recent years, the quality of a reproduction data signal is easily degraded by a decrease in signal-to-noise ratio (to be referred to as an S/N ratio hereinafter) of a reproduction signal because the reproduction signal becomes smaller along with an increase in recording density, or by an increase in defects of a recording medium. Particularly in the DAT, a signal may be omitted owing to high-speed search, which disadvantageously varies the phase and frequency of a clock. This disadvantage fluctuates the reproduction data over the range TV to output erroneous phase comparison information. In reproducing data, the phase locking of the PLL is stepped out to continuously generate errors. The reliability of the recording/reproducing apparatus greatly decreases.

FIGS. 24A and 24B show the output voltage of the charge pump 178 when the frequency of the reproduction data falls outside the lockable pull-in range of the PLL. FIG. 24A shows the case wherein the reference clock frequency is 10 MHz, and the reproduction data frequency is 8 MHz. In many cases, the frequencies of the reference clock and the reproduction data do not coincide with each other. Before reproduction data is input, the second loop is selected to make the periods of the reference and reproduction clocks coincide with each other. When the second loop is switched to the first loop, and reproduction data is input, the reproduction data should be ideally locked at 8 MHz as represented by the dotted line, but only repeatedly changes in voltage at a predetermined period and cannot be locked as represented by the solid line.

FIG. 24B shows the case wherein the reference clock frequency is 10 MHz, and the reproduction data frequency is 12 MHz. While the second loop is selected, the PLL is synchronized with the reference clock. When the second loop is switched to the first loop, and reproduction data is input, the reproduction data should be ideally locked at 12 MHz as represented by the dotted line, but the reproduction data only repeatedly changes in voltage at a predetermined period and cannot be locked as represented by the solid line.

In this manner, when the frequencies of the reference clock and the reproduction data exceed a predetermined ranges, the reproduction clock may not converge at the frequency of the reproduction data, and cannot be phase-locked with the reproduction data.

As described above, the phase comparator shown in FIG. 21 is poor in noise resistance. If the frequencies of the reference clock and the reproduction data do not substantially coincide with each other, the frequency of the reproduction clock cannot follow that of the reproduction data.

SUMMARY OF THE INVENTION

It is, therefore, an object of the present invention to provide a PLL having high noise resistance and a recording/reproducing apparatus with high reliability that includes this PLL, or a PLL and recording/reproducing apparatus in which a reference clock can be phase-locked with reproduction data even if their frequencies do not coincide with each other.

A PLL according to the present invention comprises a distributor for receiving reproduction data and sequentially distributing and outputting the reproduction data from n output terminals, n phase comparators which are respectively connected to the output terminals of the distributor, sequentially receive the reproduction data, and compare phases of the received reproduction data with a phase of a reproduction clock to output phase comparison result, a frequency comparator for receiving a reference clock and the reproduction clock and comparing a frequency of the reference clock with a frequency of the reproduction clock to output a frequency comparison result, a selector for receiving a switching control signal, the phase comparison results, and the frequency comparison result, and selecting either one of the phase comparison result and the frequency comparison result on the basis of the switching control signal to output the selected result as a voltage signal, a charge pump for receiving the voltage signal and converting the voltage signal into a current signal to output the current signal, a loop filter for receiving the current signal to output a low-frequency voltage signal, and a voltage-controlled oscillator for receiving the low-frequency voltage signal to output the reproduction clock having a corresponding frequency.

Another phase-locked loop circuit of the present invention comprises a phase comparator for receiving reproduction data and a reproduction clock and comparing a phase of the reproduction data with a phase of the reproduction clock to output a phase comparison result as a first voltage signal, a first charge pump for receiving the first voltage signal and converting the first voltage signal into a first current signal to output the first current signal, a frequency comparator for receiving a reference clock and the reproduction clock and comparing a frequency of the reference clock with a frequency of the reproduction clock to output a frequency difference, a frequency difference comparator for comparing the frequency difference with a predetermined value, and outputting a second voltage signal which has a first value when the frequency difference is larger than the predetermined value, and a second value when the frequency difference is not more than the predetermined value, a second charge pump for receiving the second voltage signal and converting the second voltage signal into a second current signal to output the second current signal, an adder for receiving the first current signal and the second current signal and adding the first current signal and the second current signal to output a third current signal, a loop filter for receiving the third current signal to output a low-frequency voltage signal, and a voltage-controlled oscillator for receiving the low-frequency voltage signal to output the reproduction clock having a frequency corresponding to the low-frequency voltage signal.

Still another phase-locked loop circuit of the present invention comprises a phase comparator for receiving reproduction data and a reproduction clock and comparing a phase of the reproduction data with a phase of the reproduction clock to output a phase comparison result, a frequency comparator for receiving a reference clock and the reproduction clock and comparing a frequency of the reference clock with a frequency of the reproduction clock to output a frequency comparison result, a first selector for receiving a switching control signal, the phase comparison result, and the frequency comparison result, and selecting either one of the phase comparison result and the frequency comparison result on the basis of the switching control signal to output the selected result as a voltage signal, a charge pump for receiving the voltage signal and converting the voltage signal into a first current signal to output the first current signal, a loop filter for receiving the first current signal to output a low-frequency voltage signal, a voltage-controlled oscillator for receiving the low-frequency voltage signal to output the reproduction clock having a frequency corresponding to the low-frequency voltage signal, a frequency direction detecting section for receiving the reproduction clock and the reproduction data, detecting whether the frequency of the reproduction clock is in a direction to come close to or go away from a frequency of the reproduction data, and outputting a second current signal corresponding to the detected direction, and a second selector for supplying the second current signal to the loop filter together with the first current signal while the first selector selects the phase comparison result, and disconnecting the frequency direction detecting section from the loop filter while the first selector selects the frequency comparison result.

The frequency direction detecting section may comprise a D flip-flop for receiving the reproduction clock at a data terminal and the reproduction data at a clock terminal, and outputting, from the data terminal, signals representing periods in which the frequency of the reproduction clock comes close to and goes away from the frequency of the reproduction data, and an integrator/voltage-to-current converter for receiving the signal, performing an integrating operation to convert the signal into the second current signal, and outputting the second current signal to the selector.

A recording/reproducing apparatus of the present invention comprises the phase-locked loop circuit, a magnetic head for reading data recorded on a surface of a recording medium to output a reproduction signal, a reproducing amplifier for receiving and amplifying the reproduction signal to output an amplified signal, and a signal processing circuit for receiving the amplified signal and the reproduction clock output from the phase-locked loop circuit, and extracting the reproduction data from the amplified signal using the reproduction clock to output the reproduction data to the phase-locked loop circuit.

According to the PLL, even when reproduction data is omitted due to a defect of a recording medium or the like, the reproduction clock can be phase-locked with the reproduction data, and the noise resistance can be increased. The recording/reproducing apparatus of the present invention can attain high reliability by employing this PLL.

BRIEF DESCRIPTION OF THE DRAWINGS

In the accompanying drawings,

FIGS. 24A and 24B are timing charts, respectively, showing the waveforms of charge pump output voltages when the frequencies of a reference clock and reproduction data are different from each other; and FIGS. 25($a$) and 25($b$) are enlarged explanatory views, respectively, showing the waveforms of the charge pump output voltages shown in FIGS. 24A and 24B.

DESCRIPTION OF THE PREFERRED EMBODIMENTS

Figure 1:
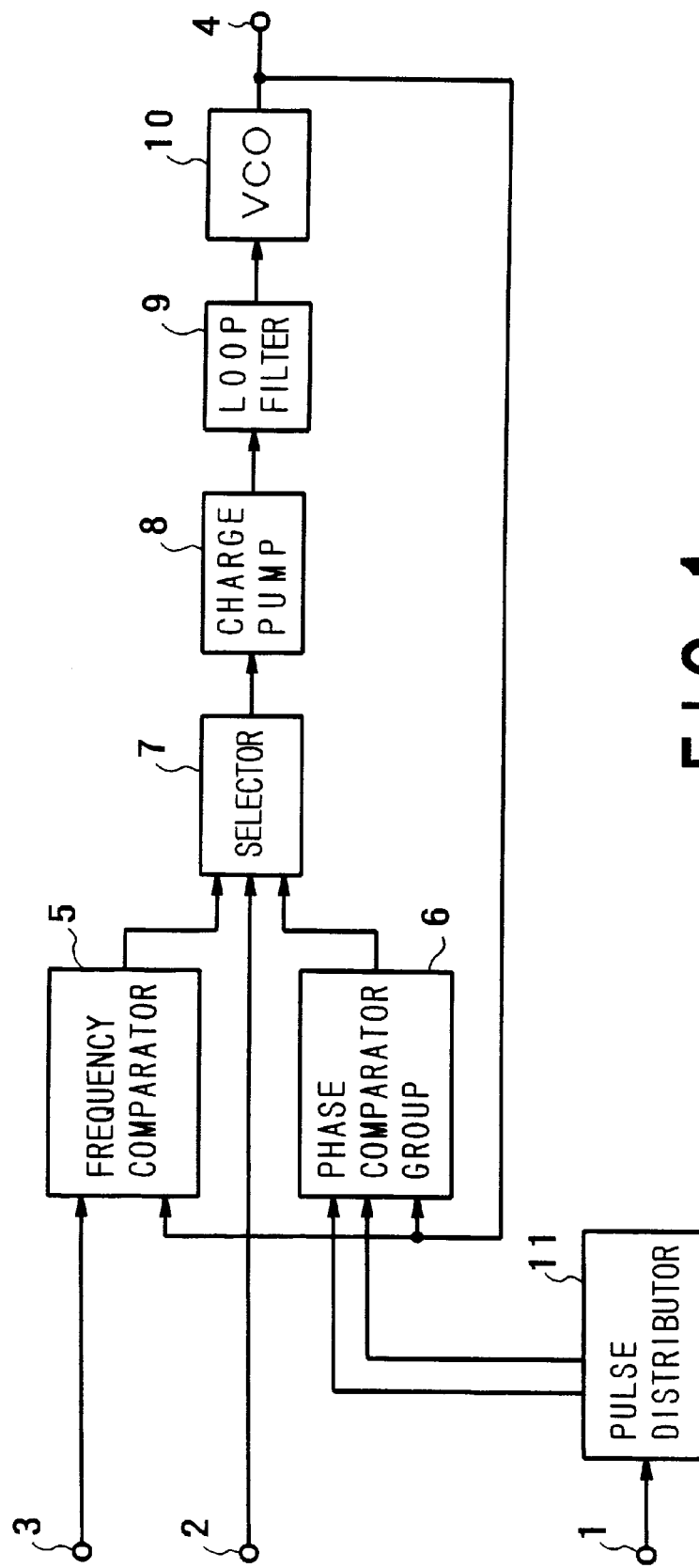
FIG. 1 is a block diagram showing the arrangement of a PLL according to the first embodiment of the present invention.
Figure 21:
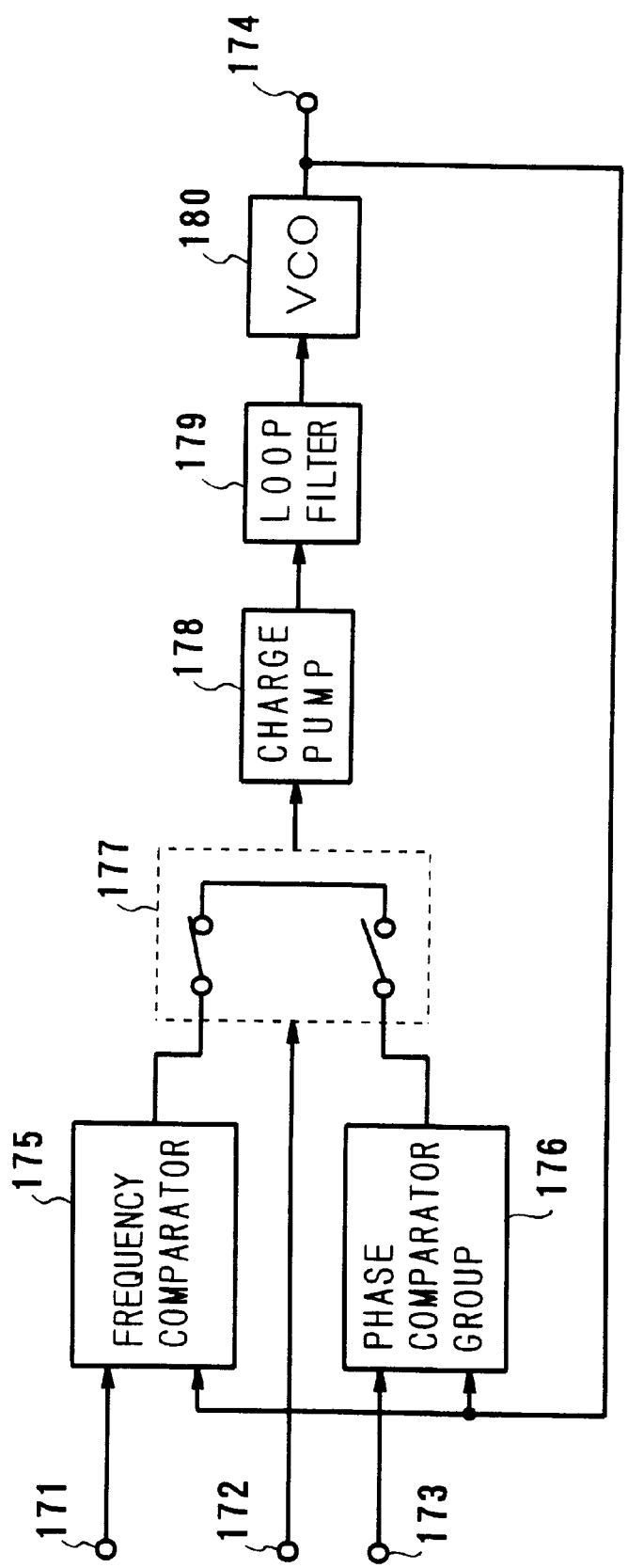
FIG. 21 is a block diagram showing the arrangement of a phase-locked loop circuit associated with the present invention.

An embodiment of the present invention will be described below with reference to the accompanying drawings. A PLL according to the first embodiment of the present invention comprises the first and second loops. As shown in FIG. 1, the PLL comprises an input terminal 3 for receiving a reference clock, an input terminal 2 for receiving a switching control signal for selecting the first or second loop, an input terminal 1 for receiving reproduction data, a frequency comparator 5, a phase comparator group 6, a selector 7, a charge pump 8, a loop filter 9, a VCO 10, an output terminal 4 for externally outputting a reproduction clock output from the VCO 10, and a pulse distributor 11. The first loop performs feedback control to make the reproduction clock phase-lock with the reproduction data. The first loop comprises the input terminals 1 and 2, the phase comparator group 6, the selector 7, the charge pump 8, the loop filter 9, the VCO 10, the output terminal 4, and the pulse distributor 11. The second loop performs feedback control to make the frequency of the reproduction clock coincide with that of the reference clock. The second loop comprises the input terminals 2 and 3, the frequency comparator 5, the selector 7, the charge pump 8, the loop filter 9, the VCO 10, and the output terminal 4. The PLL of the first embodiment is different from the PLL shown in FIG. 21 in comprising the phase comparator group 6 including two phase comparators, and the pulse distributor 11 for distributing reproduction data input from the input terminal 1 to the respective phase comparators of the phase comparator group 6.

Figure 2:
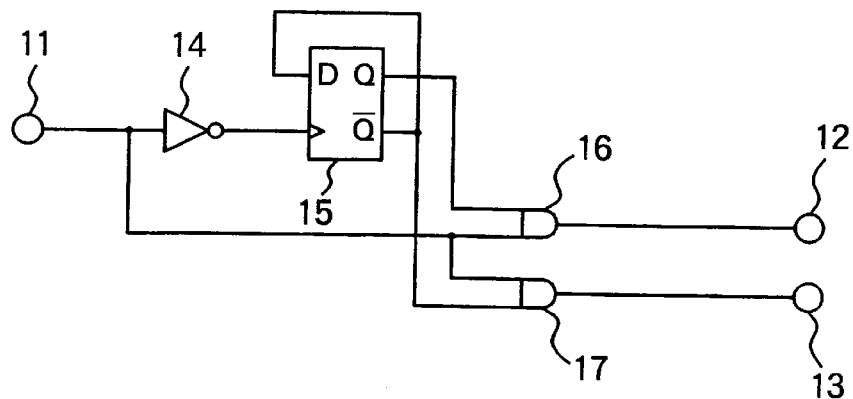
FIG. 2 is a circuit diagram showing the arrangement of a pulse distributor in the PLL.

FIG. 2 shows the detailed arrangement of the pulse distributor 11. Reproduction data is input to an input terminal 11a. The reproduction data is input to one of input terminals of each of AND circuits 16 and 17. The reproduction data is inverted by an invertor 14 and input to the clock terminal of a D flip-flop 15. An output Q from the D flip-flop 15 is input to the other input terminal of the AND circuit 16; and an inverted output /Q, to a data input terminal D of the flip-flop 15 and the other input terminal of the AND circuit 17. Outputs from the AND circuits 16 and 17 are output to the phase comparator group 6 via output terminals 12 and 13, respectively.

Figure 3:
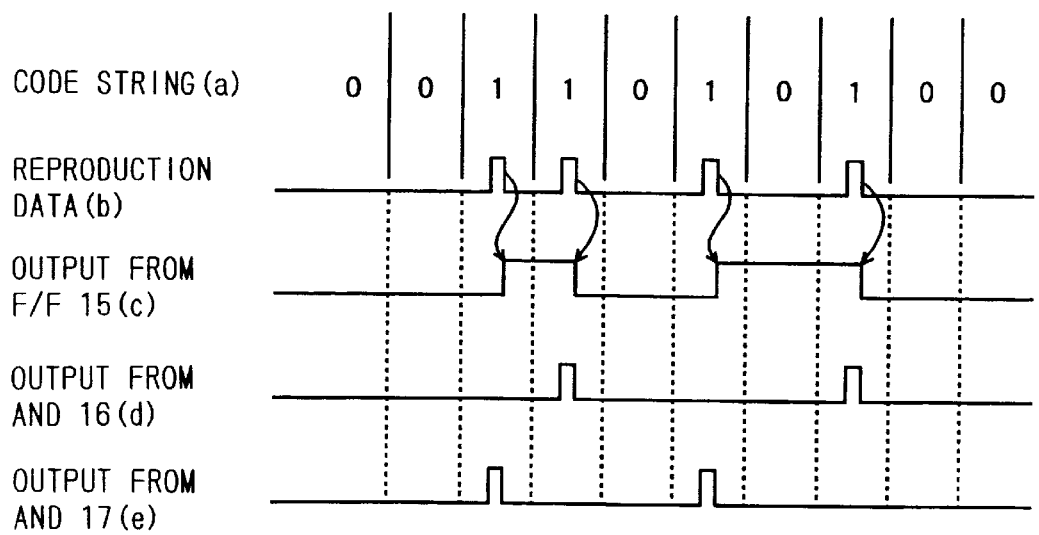
FIG. 3 is a timing chart showing the waveforms of respective signals in the PLL.

FIG. 3 shows the waveforms of a code string (a), reproduction data (b), an output signal (c) from the flip-flop 15, and output signals (d) and (e) from the AND circuits 16 and 17. The reproduction data (b) input from the input terminal 11 are alternately distributed and output from the AND circuits 16 and 17.

Figure 4:
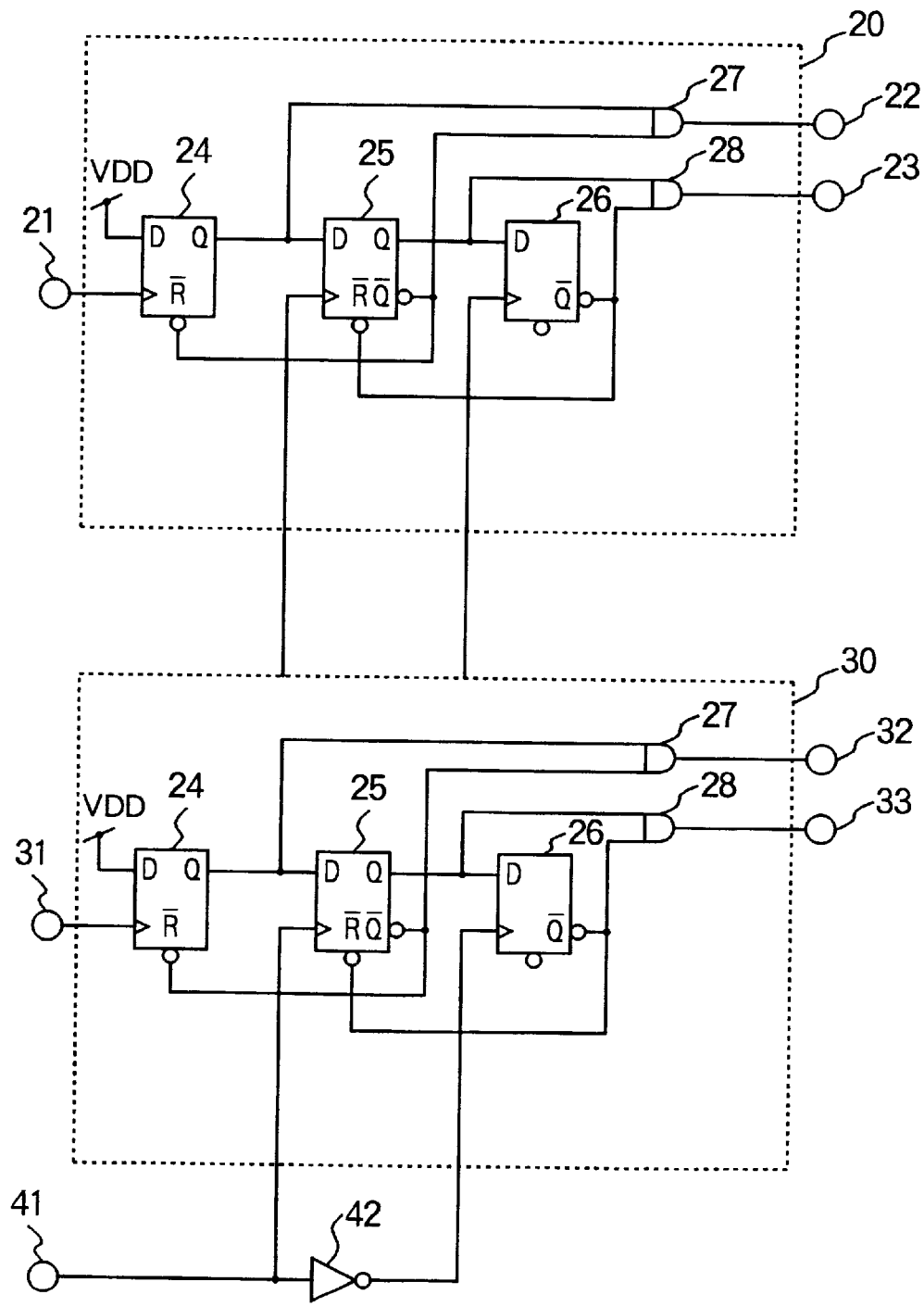
FIG. 4 is a circuit diagram showing the arrangement of a phase comparator group in the PLL.

FIG. 4 shows the arrangement of the phase comparator group 6. The phase comparator group 6 comprises input terminals 21 and 31 for alternately receiving the distributed reproduction data, phase comparators 20 and 30, output terminals 22, 23, 32, and 33, and an input terminal 41 for receiving an output from the VCO 10. The phase comparators 20 and 30 have the same arrangement, and each phase comparator comprises D flip-flops 24 to 26 and AND circuits 27 and 28. The phase comparator 20 is exemplified. The flip-flop 24 receives a power supply voltage $V_{DD}$ at a data terminal D, reproduction data (b1) at a clock terminal, and an inverted output /Q from the flip-flop 25 at a reset terminal /R. An output Q from the flip-flop 24 is input to a data terminal D of the flip-flop 25 and one input terminal of the AND circuit 27. The flip-flop 25 receives a reproduction clock output from the VCO 10 at a clock terminal, and an inverted output /Q from the flip-flop 26 at a reset terminal /R. An output Q from the flip-flop 25 is input to one input terminal of the AND circuit 28 and a data terminal D of the flip-flop 26. An inverted output /Q from the flip-flop 25 is input to the other input terminal of the AND circuit 27. The flip-flop 26 receives, at a clock terminal, an output from the VCO 10 that is inverted by an invertor 42. An inverted output /Q from the flip-flop 26 is input to the other input terminal of the AND circuit 28.

Figure 5:
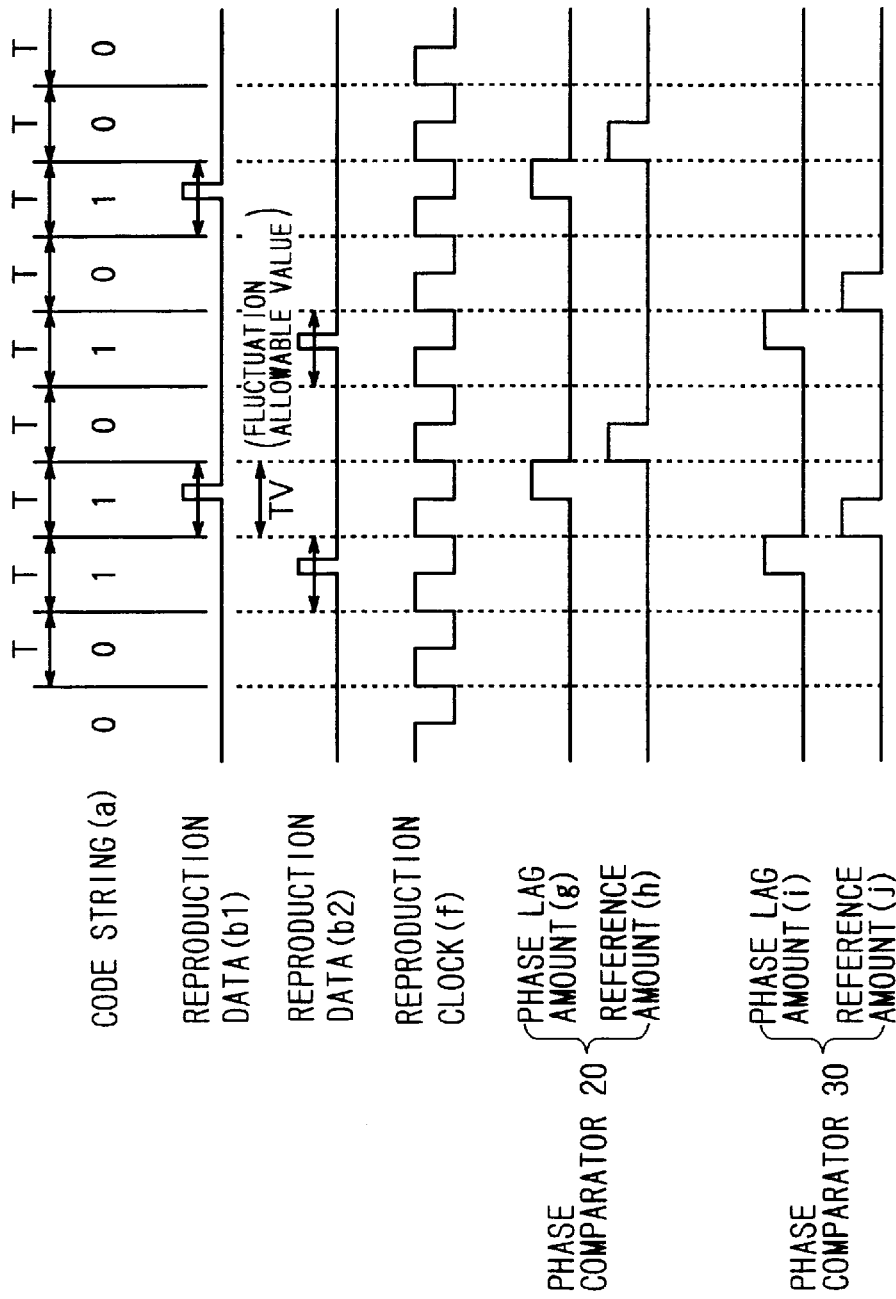
FIG. 5 is a timing chart showing the waveforms of respective signals in the PLL.
Figure 22:
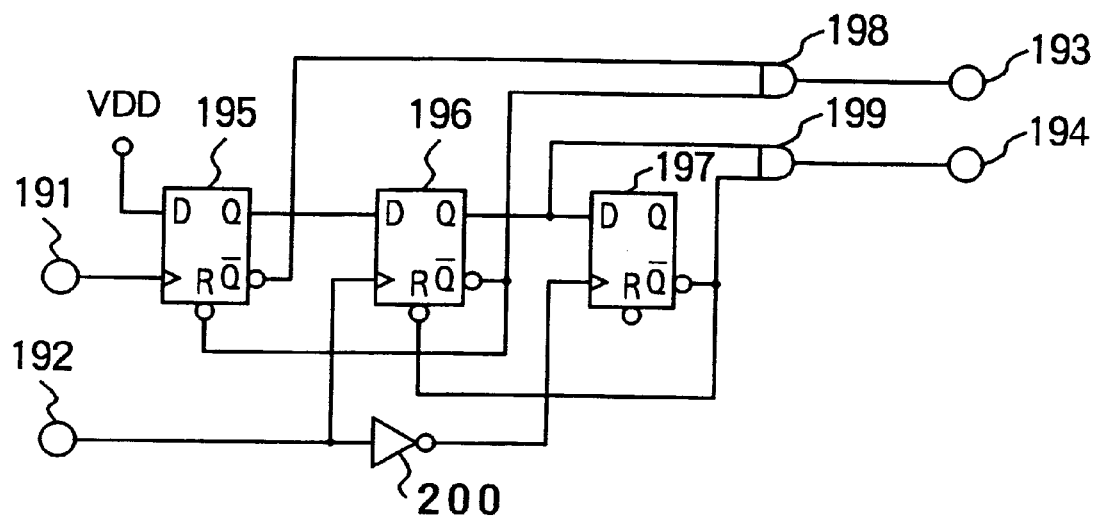
FIG. 22 is a block diagram showing the arrangement of a phase comparator in the phase-locked loop circuit.
Figure 23:
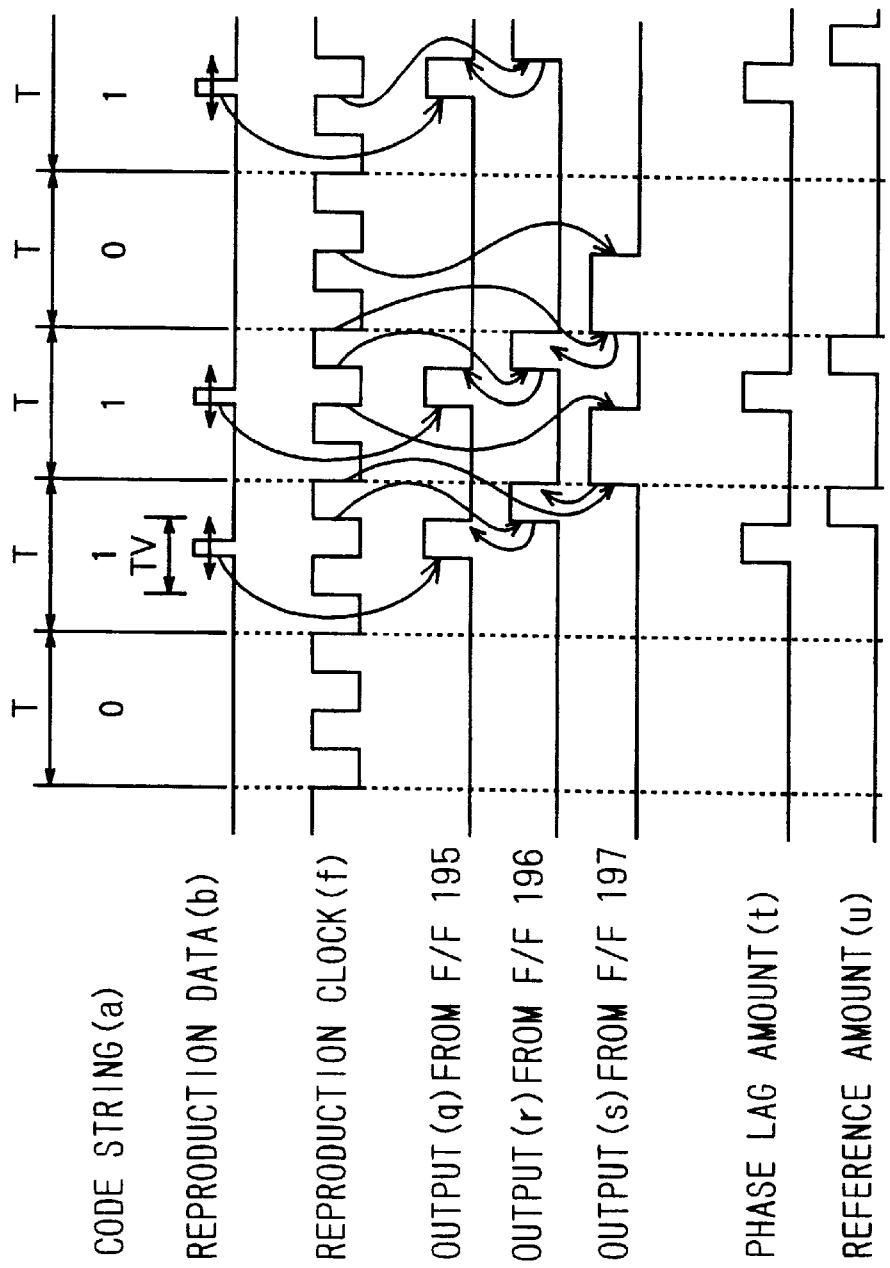
FIG. 23 is a timing chart showing the waveforms of a code string and respective signals in the phase-locked loop circuit.

FIG. 5 shows the waveforms of respective signals in the phase comparator group 6. When reproduction data (b1) and (b2) are alternately distributed and input to the input terminals 21 and 31, and an output from the VCO 10 is input to the input terminal 41, the phase lag and reference amounts about the reproduction data (b1) input to the phase comparator 20 are output from the output terminals 22 and 23 of the phase comparator 20, and the phase lag and reference amounts about the reproduction data (b2) input to the phase comparator 30 are output from the output terminals 32 and 33 of the phase comparator 30. One period of each of the reproduction data (b1) and (b2) coincides with one period T of the code string, and the pulse width of each of the phase lag and reference amounts coincides with the pulse width (½·T) of the reproduction clock (f). In the phase comparator 176 shown in FIG. 22, one period of reproduction data is ½·T the code string, and the pulse width of each of the phase lag and reference amounts is ¼·T the code string, as shown in FIG. 23. Therefore, the period of the reproduction clock in the first embodiment is twice the conventional period. This is because reproduction data can be distributed to the two phase comparators 20 and 30 to prevent adjacent reproduction data from being successively input to the same phase comparator and to double the period of reproduction data.

Figure 6:
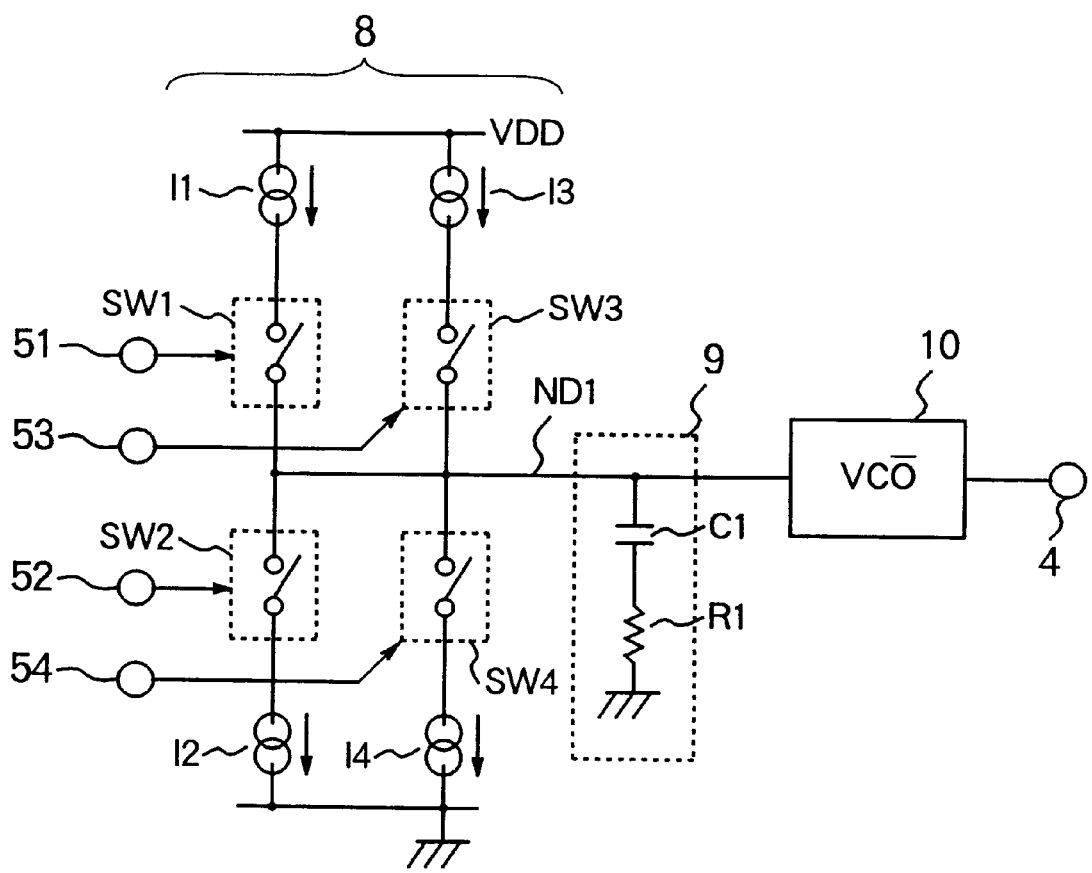
FIG. 6 is a circuit diagram showing the arrangement of a charge pump, a loop filter, and a VCO in the PLL.

FIG. 6 shows the charge pump 8 having input terminals 51 to 54 for receiving the phase lag and reference amounts respectively output from the output terminals 22, 23, 32, and 33 of the phase comparator group 6, switching elements SW1 to SW4, and constant current sources I1 to I4, the loop filter 9 having a capacitance C1 and a resistance R1, the VCO 10, and the output terminal 4. The first system of the charge pump 8 is constituted by series-connecting the constant current source I1, the switching elements SW1 and SW2, and the constant current source I2 between a power supply voltage $V_{DD}$ terminal and the ground terminal. The second system is constituted parallel to the first system by series-connecting the constant current source I3, the switching elements SW3 and SW4, and the constant current source I4 between the power supply voltage $V_{DD}$ terminal and the ground terminal. The connection node between the switching elements SW1 and SW2, and the connection node between the switching elements SW3 and SW4 are connected to an output node ND1. The first system performs a charge/discharge operation in accordance with an output from the phase comparator 20, whereas the second system performs a charge/discharge operation in accordance with an output from the phase comparator 30.

When the phase lag amount output from the output terminal 22 of the phase comparator 20 is input to the input terminal 51, the switching element SW1 is closed, and the switching element SW2 keeps an open state to charge the capacitance C1 of the loop filter 9 via the node ND1. When the reference amount output from the output terminal 23 of the phase comparator 20 is input to the input terminal 52, the switching element SW1 is opened, and the switching element SW2 is closed to discharge the capacitance C1 of the loop filter 9 via the node ND1. When the phase lag amount output from the output terminal 32 of the phase comparator 30 is input to the input terminal 53, the switching element SW3 is closed, and the switching element SW4 keeps an open state to charge the capacitance C1 of the loop filter 9 via the node ND1. When the reference amount output from the output terminal 33 of the phase comparator 30 is input to the input terminal 54, the switching element SW3 is opened, and the switching element SW4 is closed to discharge the capacitance C1 of the loop filter 9 via the node ND1. In this manner, adjacent reproduction data are alternately supplied to the phase comparators 20 and 30, and outputs from the phase comparators 20 and 30 are supplied to the first and second systems, thereby alternately charging/discharging the capacitance C1 of the loop filter 9. The potential of the output node ND1 is determined by the charge amount of the capacitance C1 of the loop filter 9, and the oscillation frequency of the VCO 10 is determined in accordance with this potential.

In the first embodiment, the charge pump is divided into two systems in correspondence with outputs from the two phase comparators 20 and 30 to charge/discharge and the capacitance C1 of the loop filter 9. Instead, outputs from the phase comparators 20 and 30 may be summed into one using a logic circuit to charge/discharge the capacitance C1.

As described above, reproduction data fluctuates in the time axis direction due to noise or the like. In the first embodiment, the fluctuation allowable range TV is equal to one period T of the code string. The fluctuation allowable range TV of the phase comparator 176 shown in FIG. 22 is ½·T the code string, whereas the allowable range in the first embodiment is twice the range TV. Accordingly, the noise resistance increases.

In the first embodiment, the phase comparator group 6 is made up of the two phase comparators 20 and 30, and reproduction data are alternately distributed to the phase comparators 20 and 30 by the pulse distributor 11. However, it is also possible to constitute the phase comparator group 6 by three or more phase comparators, and sequentially distribute reproduction data by the pulse distributor 11. When n (n is an integer equal to or larger than 2) phase comparators are arranged to sequentially distribute reproduction data, the reproduction data period can be set n times the period in the phase comparator 176 of FIG. 22. When the phase comparator group 6 is made up of the n phase comparators, the charge pump may be divided into n systems to charge/discharge the capacitance of the loop filter. Alternatively, outputs from the n phase comparators may be summed into one by a logic circuit to charge/discharge the capacitance by the charge pump.

Figure 7:
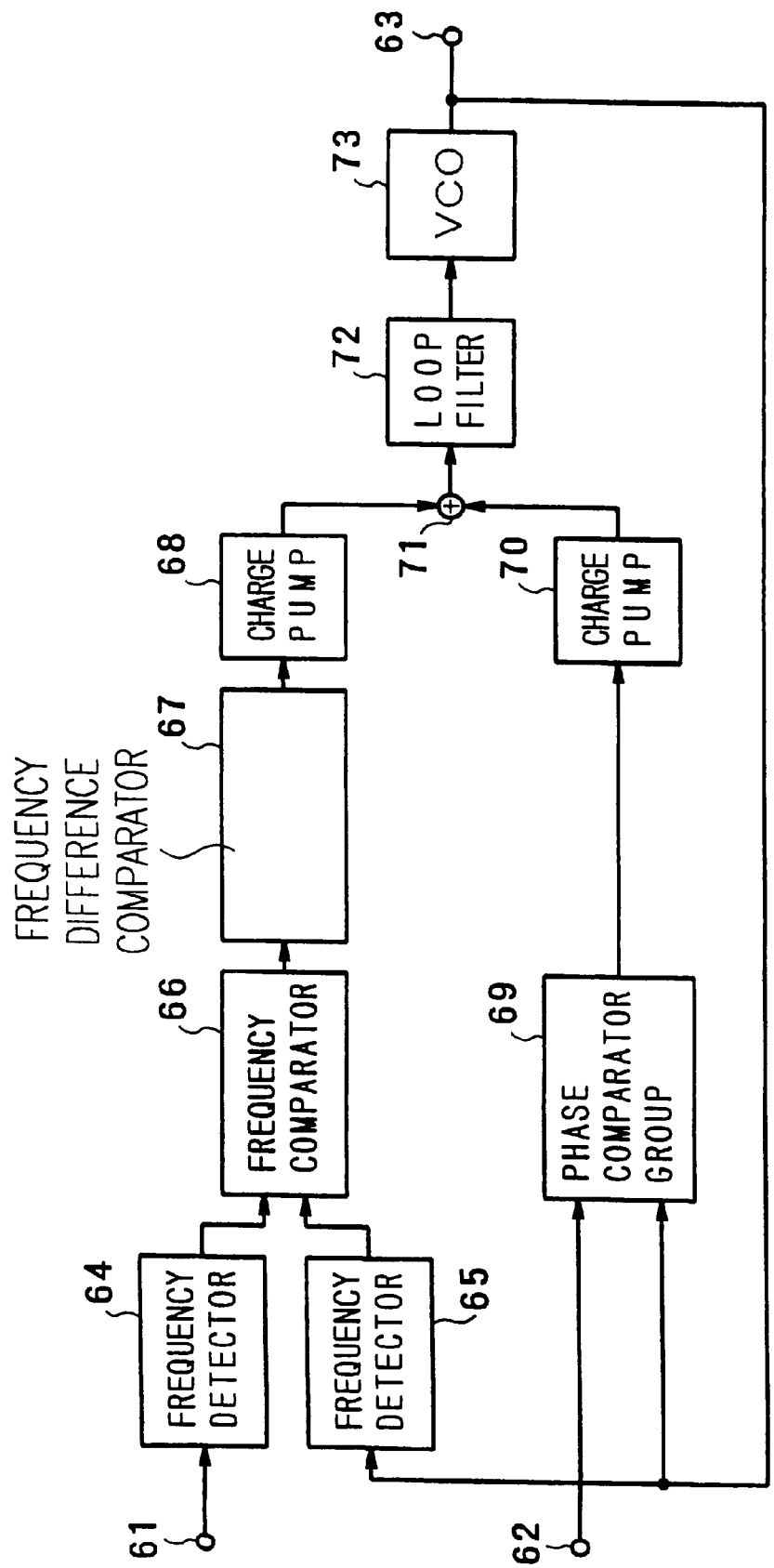
FIG. 7 is a block diagram showing the arrangement of a PLL according to the second embodiment of the present invention.

A PLL according to the second embodiment of the present invention has an arrangement shown in FIG. 7. This PLL is constituted by the first loop having an input terminal 62 for receiving reproduction data, a phase comparator 69, a charge pump 70, an adder 71, a loop filter 72, and a VCO 73, and the second loop having an input terminal 61 for receiving a reference clock, frequency detectors 64 and 65, a frequency comparator 66, a frequency difference comparator 67, a charge pump 68, the adder 71, the loop filter 72, and the VCO 73.

Figure 8:
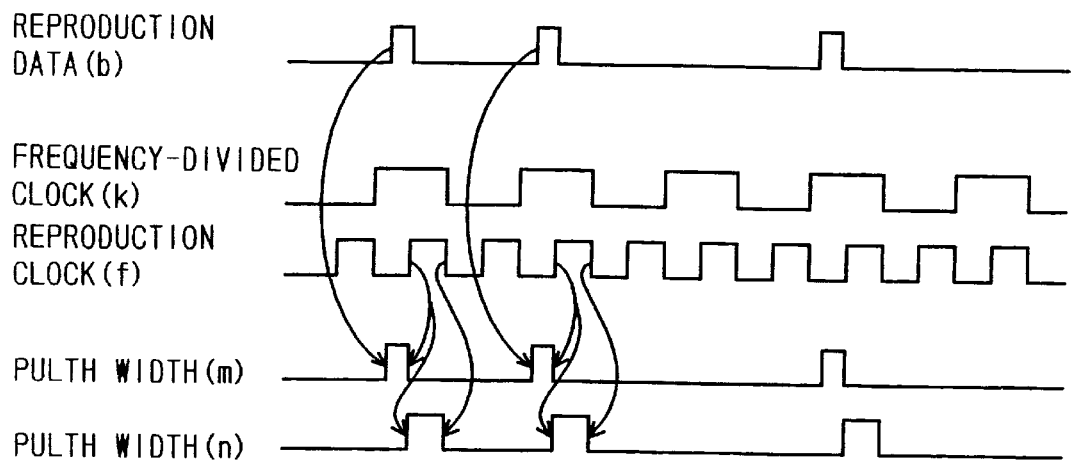
FIG. 8 is a timing chart showing the waveforms of respective signals in the PLL.

In the first loop, the phase comparator 69 receives reproduction data input via the input terminal 62 and a reproduction clock output from the VCO 73, and compares their phases to output a signal representing a pulse width. FIG. 8 shows the waveforms of reproduction data (b), a reproduction clock (f), a clock (k) ½-frequency-divided by the phase comparator 69, and pulse width signals (m) and (n). The pulse width signal (m) represents a pulse width between the leading edge of the reproduction data (b) and the leading edge of the reproduction clock (f). The pulse width signal (n) represents the same pulse width as that of the reproduction clock (f). A pulse width difference between the pulse width signals (m) and (n) indicates a phase difference, and these signals are supplied to the charge pump 70. Upon reception of the pulse signals (m) and (n), the charge pump 70 converts them into current signals by voltage-to-current conversion, and inputs the current signals to the loop filter 72 via the adder 71.

Figure 9:
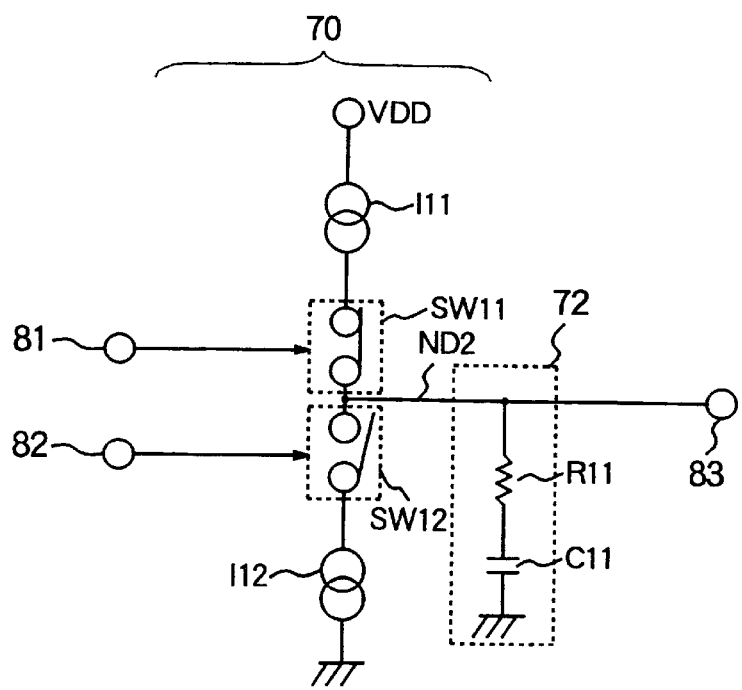
FIG. 9 is a circuit diagram showing the arrangement of a charge pump, a loop filter, and a VCO in the PLL.

FIG. 9 shows the detailed circuit arrangement of the charge pump 70 and the loop filter 72. The pulse width signals (m) and (n) are input to input terminals 81 and 82. A constant current source I11, switching elements SW11 and SW12, and a constant current source I12 are series-connected between the power supply voltage $V_{DD}$ terminal and the ground terminal. The switching element SW11 is turned on upon reception of a high-level pulse width signal (m) and turned off upon reception of a low-level pulse width signal (m). The switching element SW12 is turned on upon reception of a high-level pulse width signal (n) and turned off upon reception of a low-level pulse width signal (n). The connection node between the switching elements SW11 and SW12 is connected to a node ND2, which is connected to the input terminal of the loop filter 72 and an output terminal 83. The pulse width signals (m) and (n) do not simultaneously change to high level. The pulse width signals (m) and (n) are respectively input to the switching elements SW11 and SW12 to turn on the switching elements SW11 and SW12 for times corresponding to the widths of the pulse width signals (m) and (n). The pulse width signals are converted into current signals, which are output from the node ND2.

The loop filter 72 has a resistance R11 and a capacitance C11 series-connected between the node ND2 and the ground terminal. The capacitance C11 is charged/discharged in accordance with the current signal supplied via the node ND2. At this time, the loop filter 72 outputs a low-frequency-component voltage signal to the VCO 73 via the output terminal 83. In response to this signal, the reproduction clock (f) output from the VCO 73 is feedback-controlled to be made to phase-lock with the reproduction data (b).

However, by only the feedback control of the first loop, even if the frequency of the reproduction clock output from the VCO 73 does not coincide with that of the reproduction data, when, e.g., they have a common multiple relationship, the charge and discharge times in the charge pump 70 often coincide with each other to set a pseudo lock state. The second embodiment therefore adopts the second loop to cause the frequency of the reproduction clock to fall within a predetermined range of the reference clock and make their frequencies and phases coincide with each other without setting any pseudo lock state.

Figure 10:
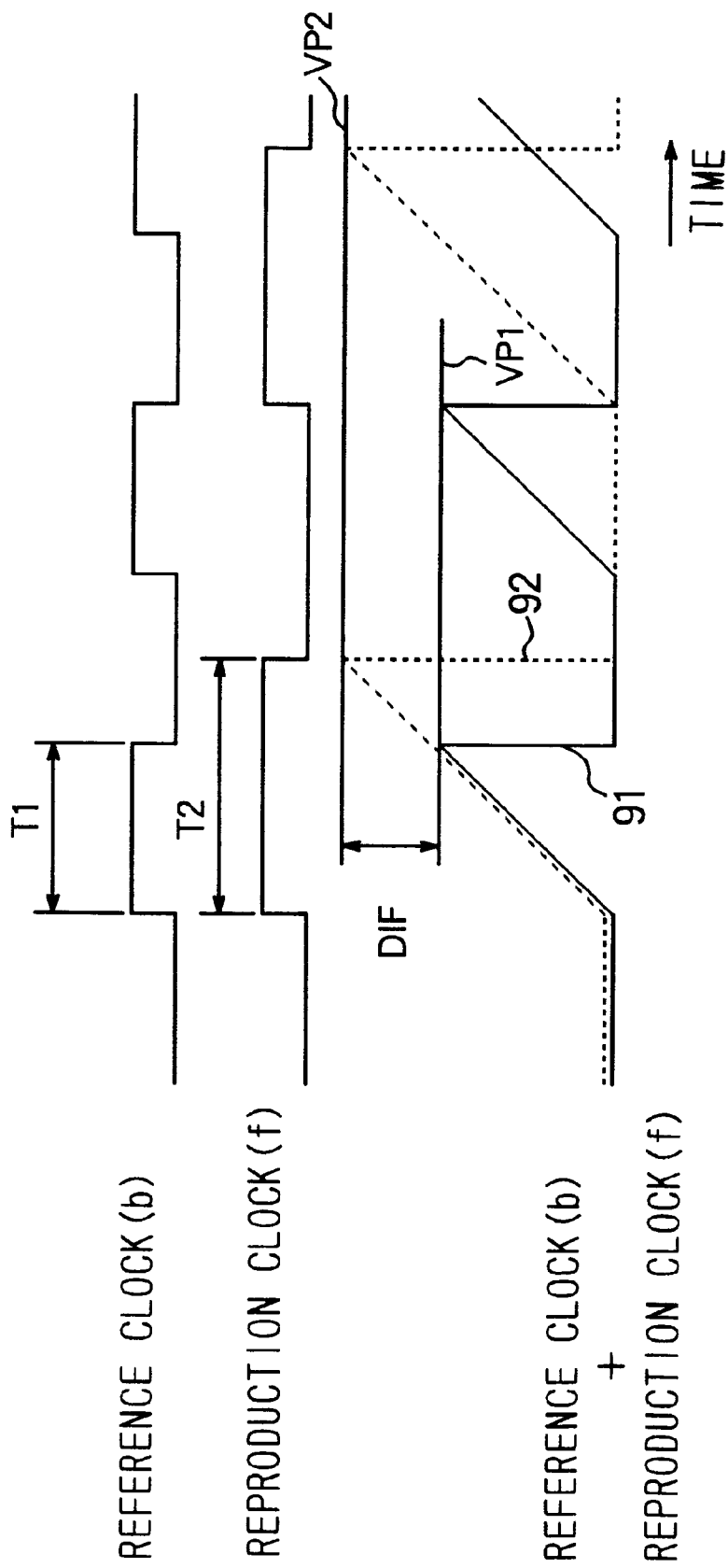
FIG. 10 is a timing chart showing the waveforms of input and output signals of a frequency detector in the PLL.

In the second loop, the reference clock is input via the input terminal 61 to the frequency detector 64, and the reproduction clock is output from the VCO 73 to the frequency detector 65. FIG. 10 shows the waveforms of a reference clock (b) and a reproduction clock (f). The reference clock (b) has a period T1, and the reproduction clock (f) has a period T2 longer than the period T1. The frequency of the reproduction clock (f) is lower.

If the reference clock (b) is input to the frequency detector 64, its frequency is detected by the frequency detector 64. If the reproduction clock (f) output from the VCO 73 is input to the frequency detector 65, its frequency is detected by the frequency detector 65. More specifically, if the reference clock (b) is input to the frequency detector 64, the internal capacitance of the frequency detector 64 is charged by a constant current while the reference clock (b) is at high level, and the output potential of the capacitance increases, as indicated by a solid line 91 in FIG. 10. When the reference clock (b) changes to low level, the capacitance is discharged. Similarly, if the reproduction clock (f) is input to the frequency detector 65, the internal capacitance of the frequency detector 65 is charged by a constant current while the reproduction clock (f) is at high level, and the output potential of the capacitance increases, as indicated by a dotted line 92 in FIG. 10. When the reproduction clock (f) changes to low level, the capacitance is discharged.

When outputs from the frequency detectors 64 and 65 indicated by the solid line 91 and the dotted line 92 are input to the frequency comparator 66, the frequency comparator 66 compares the. frequencies of the reference clock (b) and the reproduction clock (f). More specifically, in FIG. 10, if outputs from the frequency detectors 64 and 65 are input to the frequency comparator 66, the frequency comparator 66 detects a potential difference DIF between a peak voltage VP1 of the solid line 91 and a peak voltage VP2 of the dotted line 92. The peak voltages VP1 and VP2 are inversely proportional to the frequencies of the reference clock (b) and the reproduction clock (f), and are obtained by converting the frequencies into voltages. The potential difference DIF between the peak voltages VP1 and VP2 indicates a frequency difference between the reference clock (b) and the reproduction clock (f).

Figure 11:
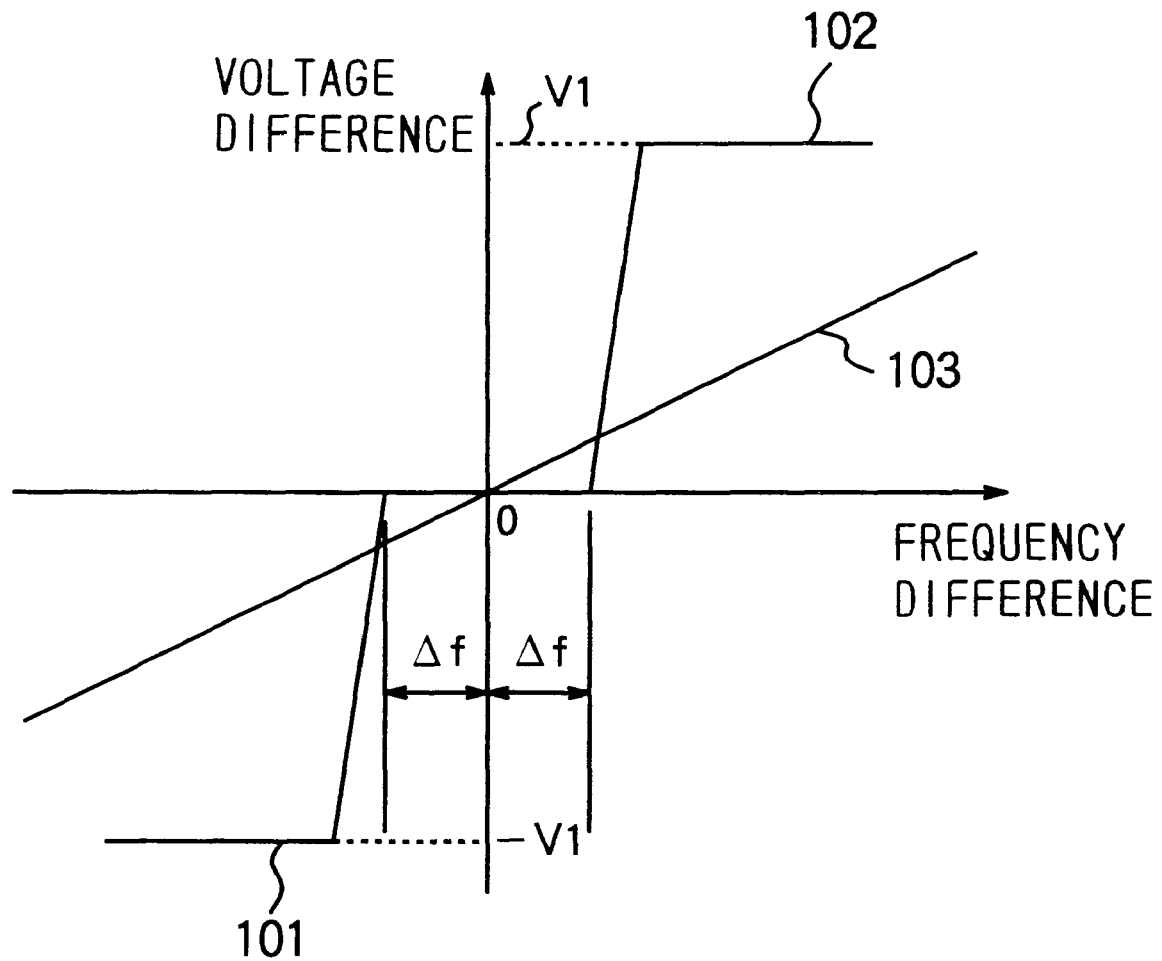
FIG. 11 is a graph showing the waveforms of input and output signals of a characteristic setting unit in the PLL.

When the frequency comparator 66 outputs this potential difference DIF to the characteristic setting unit 67, the characteristic setting unit 67 compares the potential difference DIF with a predetermined value. In FIG. 11, a solid line 103 indicates an output from the frequency comparator 66, and ±Δf is a predetermined comparison value. The potential difference DIF output from the frequency comparator 66 is proportional to the frequency difference, as indicated by the solid line 103. The characteristic setting unit 67 compares the absolute value of the potential difference DIF with the predetermined value Δf, and converts the potential difference DIF into a voltage signal indicated by a solid line 102 which is constant at ±V1 when the potential difference DIF is larger than the predetermined value Δf, and is at 0 V when the potential difference DIF is equal to or smaller than the predetermined value Δf. That is, the characteristic setting unit 67 characteristic-converts a linear input voltage indicated by the solid line 103 into a nonlinear output voltage indicated by the solid line 102 to output the comparison result between the frequency difference and the predetermined value.

When the characteristic setting unit 67 outputs the voltage indicated by the solid line 102, the charge pump 68 converts the input voltage signal into a current signal and outputs the current signal. If the frequency difference falls within the range of the predetermined value ±Δf in the solid line 102, the output voltage of the characteristic setting unit 67 is 0 V, so no charging/discharging is performed. In this case, the second loop is open, and only the first loop performs feedback control. When the frequency difference exceeds the predetermined value ±Δf, the output voltage of the characteristic setting unit 67 becomes ±V1, and the charge pump 68 performs voltage-to-current conversion to output a current signal. Then, the second loop shifts to an operating state. The output current from the second loop is added to and synthesized with the current signal output from the charge pump 70 in the first loop by the adder 71. The synthesized current signal is supplied to the loop filter 72 to charge/discharge the internal capacitance of the loop filter 72. The high-frequency components of the current signals supplied from the charge pumps 70 and 68 are removed to obtain a low-frequency voltage signal, which is input to the VCO 73. The VCO 73 generates a reproduction clock having a frequency corresponding to the level of the voltage signal, and outputs it externally via the VCO 63 and to the frequency detector 65 and the phase comparator 69.

In the second embodiment, the first and second loops are synthesized, and the frequency of the reproduction clock output from the VCO 73 can be brought close to the frequency of the reference clock. Accordingly, even if a medium has a defect or the like, and reproduction data is omitted due to a defect of a medium or the like, a reproduction clock phase-locked with the reproduction data can be reliably output.

A PLL according to the third embodiment will be explained. As described above with reference to FIGS. 24A and 24B, in the PLL shown in FIG. 21, a reproduction clock is phase-locked with a reference clock while the second loop operates. However, after the second loop is switched to the first loop, no reproduction clock is phase-locked with reproduction data, and the output voltage of the charge pump changes wavily. The waveform of the output voltage of the charge pump was checked to find the following fact. As shown in FIG. 25A, when the frequency of the reference clock is higher than that of the reproduction data, the output waveform of the charge pump is asymmetrical as indicated by a solid line L1 while the first loop operates, and becomes symmetrical as indicated by a dotted line L2 while no first loop operates. As shown in FIG. 25B, when the frequency of the reference clock is lower than that of the reproduction data, the output waveform of the charge pump is asymmetrical as indicated by a solid line L3 while the first loop operates, and becomes symmetrical as indicated by a dotted line L4 while no first loop operates. The waveform becomes asymmetrical under feedback control because the frequency of the reproduction clock changes quickly in a direction to come close to the frequency of the reproduction data, but slowly in a direction to go away. In the third embodiment, therefore, whether the frequency of the reproduction clock comes close to or goes away from the frequency of the reproduction data is detected from the asymmetrical output waveform of the charge pump, and the phase lockable range is widened without increasing jitters.

Figure 12:
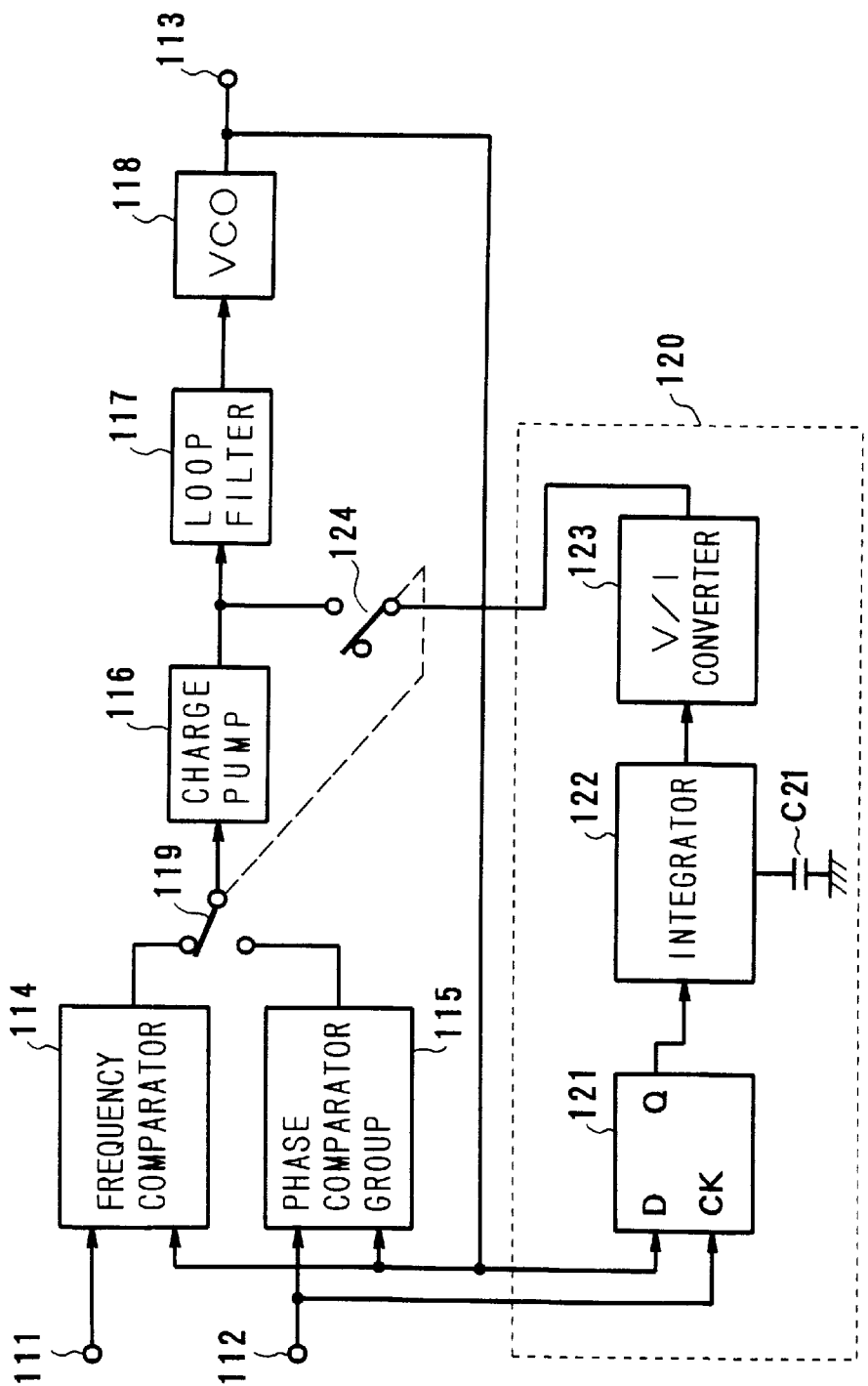
FIG. 12 is a block diagram showing the arrangement of a PLL according to the third embodiment of the present invention.

A frequency direction detecting section 120 in FIG. 12 comprises a D flip-flop 121, an integrator 122, a capacitance C21, and a voltage-to-current converter 123. The D flip-flop 121 receives a reproduction clock at a data terminal D and reproduction data at a clock terminal CK, and supplies an output from an output terminal Q to the integrator 122. The integrator 122 charges the capacitance C21 with the voltage output from the flip-flop 121, converts it into a low-frequency voltage, and then outputs the low-frequency voltage to the voltage-to-current converter 123. The voltage-to-current converter 123 converts the supplied voltage signal into a current signal, and supplies the current signal to a loop filter 117 via a selector 124. As a result, the loop filter 117 receives an added current of an output current from a charge pump 116 and the output current from the voltage-to-current converter 123 to perform charging/discharging. The connection states of a selector 119 and the selector 124 are interlockingly switched. While the first loop is selected, i.e., the reproduction data is input to an input terminal 112, the selector 119 is switched to supply an output from a phase comparator 115 to the charge pump 116, and the selector 124 is switched to supply an output from the frequency direction detecting section 120 to the loop filter 117. While the second loop is selected, i.e., the reference clock is input to the input terminal 112 instead of the reproduction data, the selector 119 supplies an output from a frequency comparator 114 to the charge pump 116, and the selector 124 disconnects the output terminal of the frequency direction detecting section 120 from the input terminal of the loop filter 117.

Figure 13:
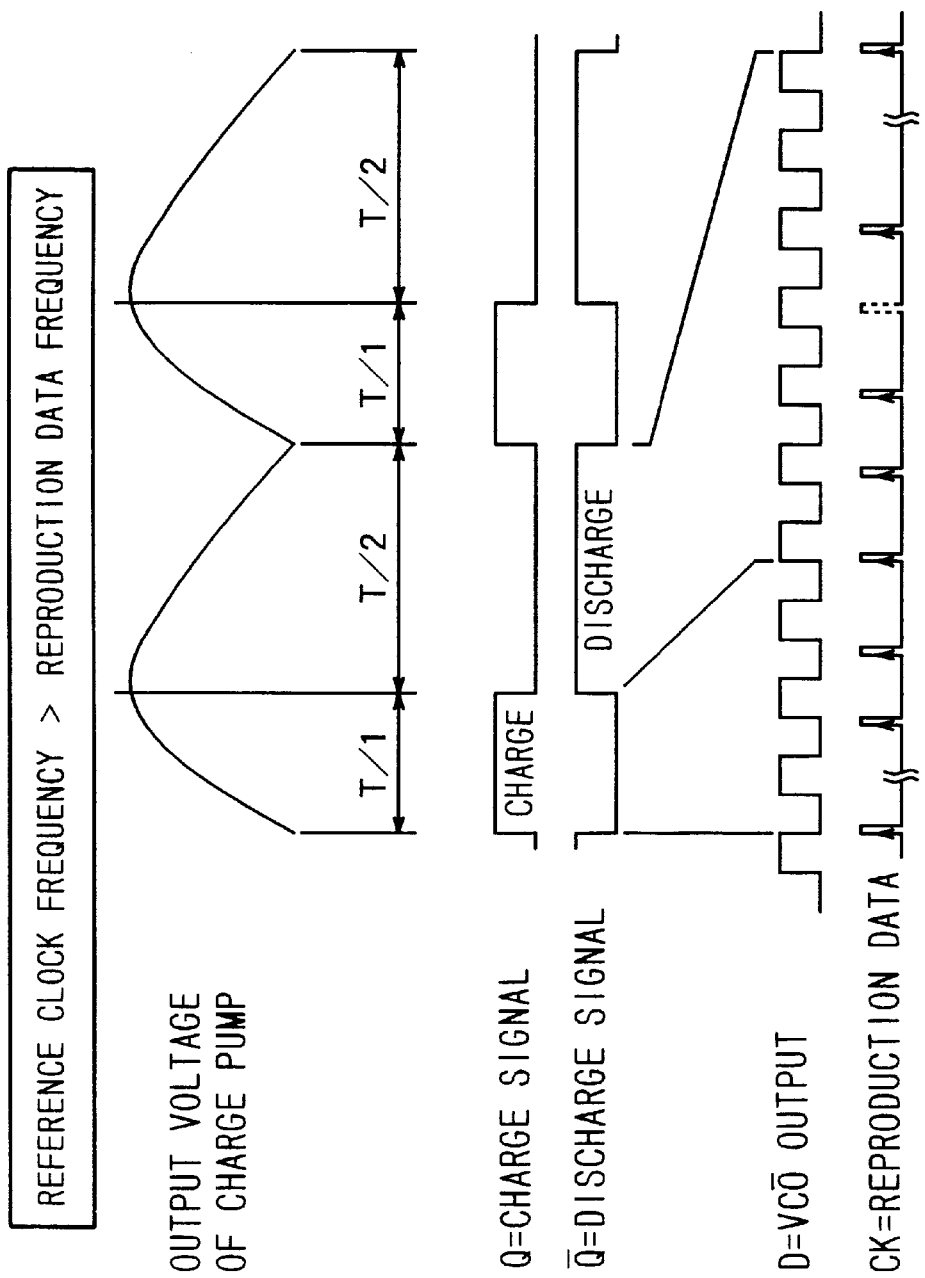
FIG. 13 is a timing chart showing the waveforms of respective signals in the PLL when the frequency of a reference clock is higher than that of reproduction data.

The operation of the third embodiment having this arrangement will be described. When the frequency of the reference clock is higher than that of the reproduction data, the output voltage of the charge pump has an asymmetrical waveform with times T/1 and T/2, as shown in FIG. 13. The time T/1 is equivalent to the charge time, and the time T/2 is to the discharge time. When the reproduction clock and the reproduction data are input to the flip-flop 121, a charge signal which keeps high level during the time T/1 is output from the output terminal Q, and a discharge signal which keeps high level during the time T/2 is output from an inverted output terminal /Q, as shown in FIG. 13. That is, the charge and discharge times are extracted. The charge signal and/or the discharge signal is input to the integrator 122, and superposed on a current signal from the charge pump 116 via the integrator 122 and the voltage-to-current converter 123. In this case, since the frequency of the reference clock is higher than that of the reproduction data, a current signal having a long discharge time is output from the voltage-to-current converter 123, and superposed on the current signal from the charge pump 116 to increase the discharge time in the loop filter 117 longer than the charge time. According to the third embodiment, the pull-in range where the reproduction clock can be made to phase-lock with the reproduction data is widened, compared to the conventional range.

Figure 14:
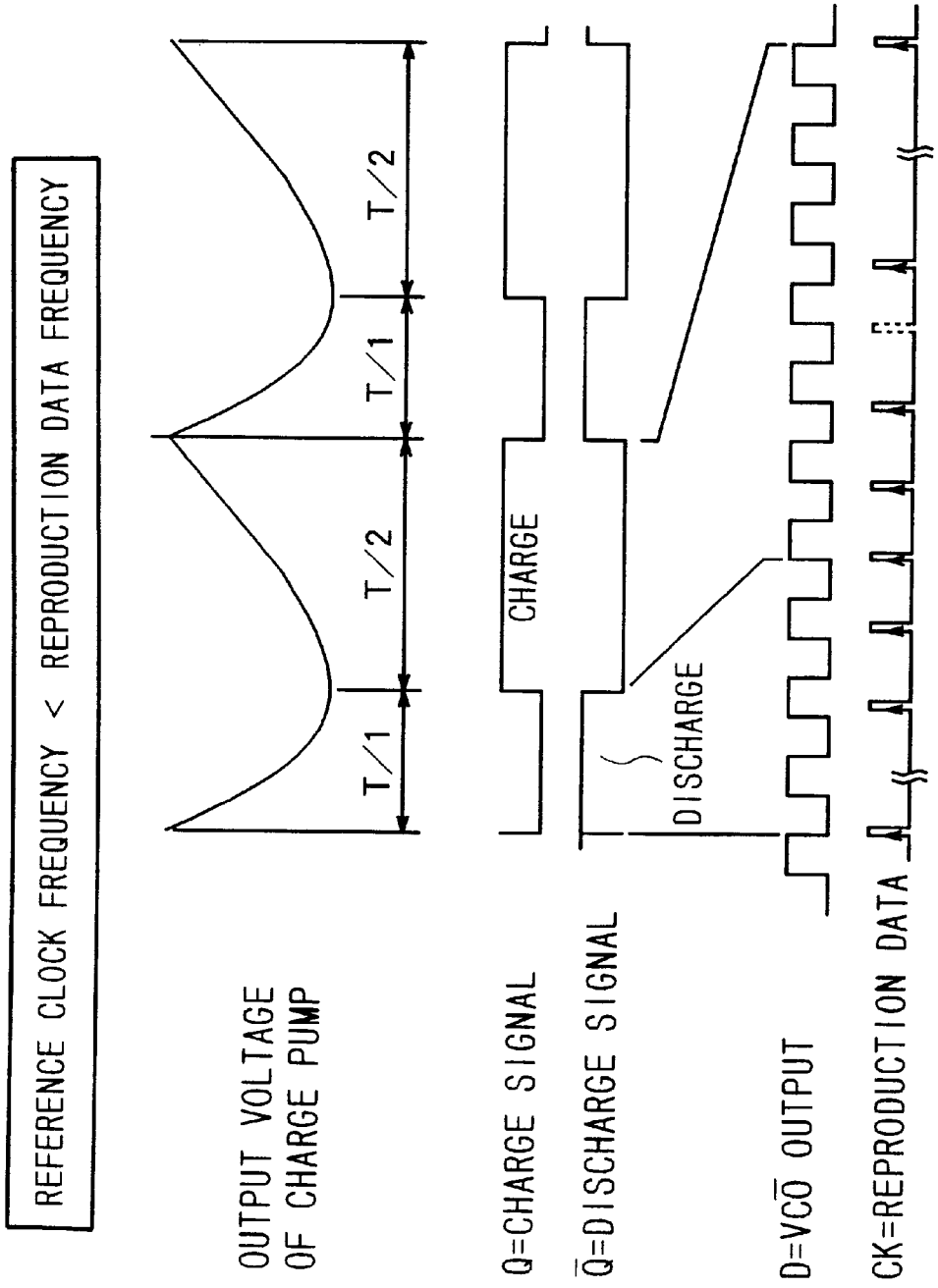
FIG. 14 is a timing chart showing the waveforms of the respective signals in the PLL when the frequency of the reference clock is lower than that of the reproduction data.

To the contrary, when the frequency of the reference clock is lower than that of the reproduction data, the output voltage of the charge pump has an asymmetrical waveform with times T/1 and T/2, as shown in FIG. 14. When the reproduction clock and the reproduction data are input to the flip-flop 121, a discharge signal which keeps high level during the time T/1 is output from the output terminal Q, and a charge signal which keeps high level during the time T/2 is output from the inverted output terminal /Q, as shown in FIG. 14. The charge signal and/or the discharge signal is input to the integrator 122, and superposed via the integrator 122 and the voltage-to-current converter 123 on a current signal from the charge pump 116. Since the frequency of the reference clock is lower than that of the reproduction data, a current signal having a long charge time is output from the voltage-to-current converter 123, and superposed on the current signal from the charge pump 116 to increase the charge time in the loop filter 117 longer than the discharge time. As a result, the pull-in range where the reproduction clock can be made to phase-lock with the reproduction data is widened.

Figure 15:
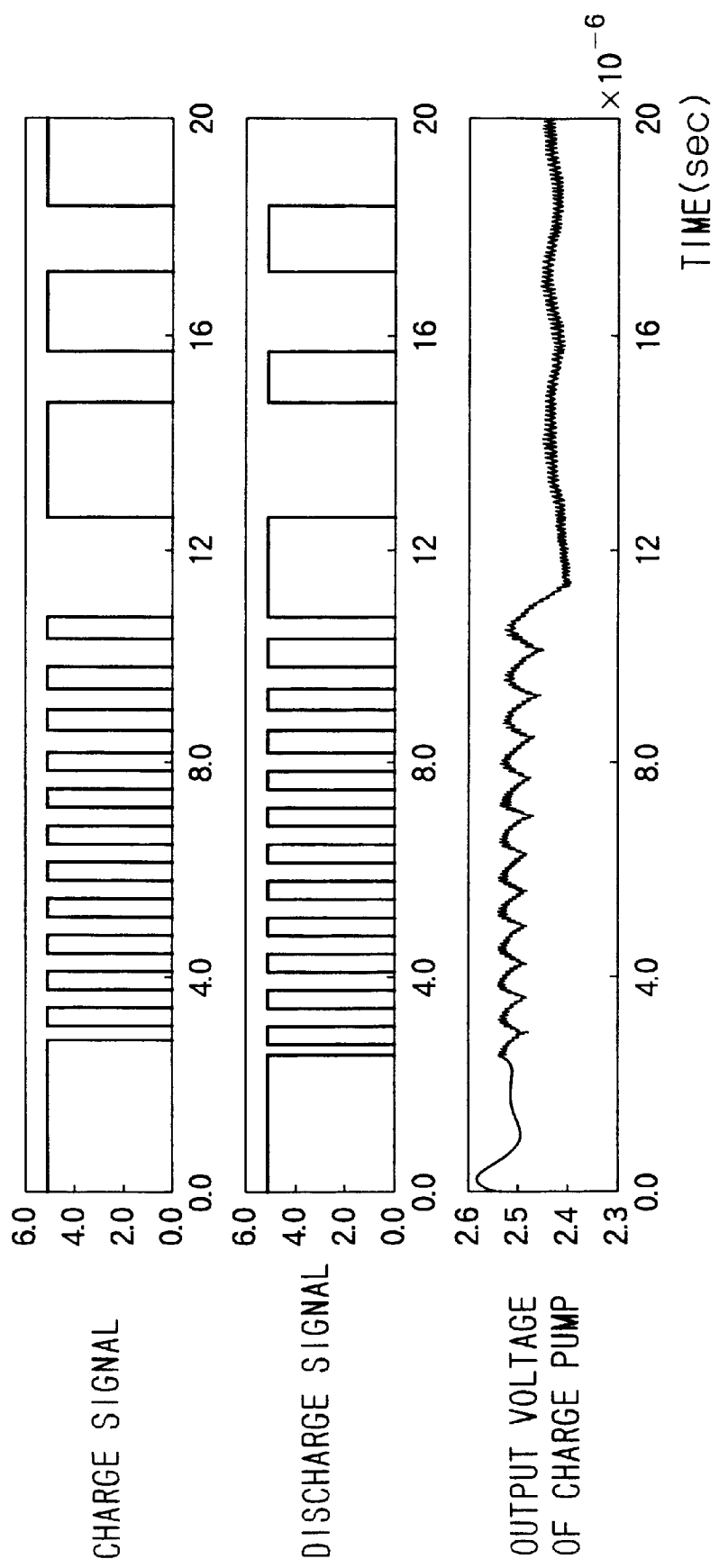
FIG. 15 is a graph showing the simulation results of a charge signal, a discharge signal, and a charge pump output voltage in the PLL when the frequency of the reference clock is higher than that of the reproduction data.
Figure 16:
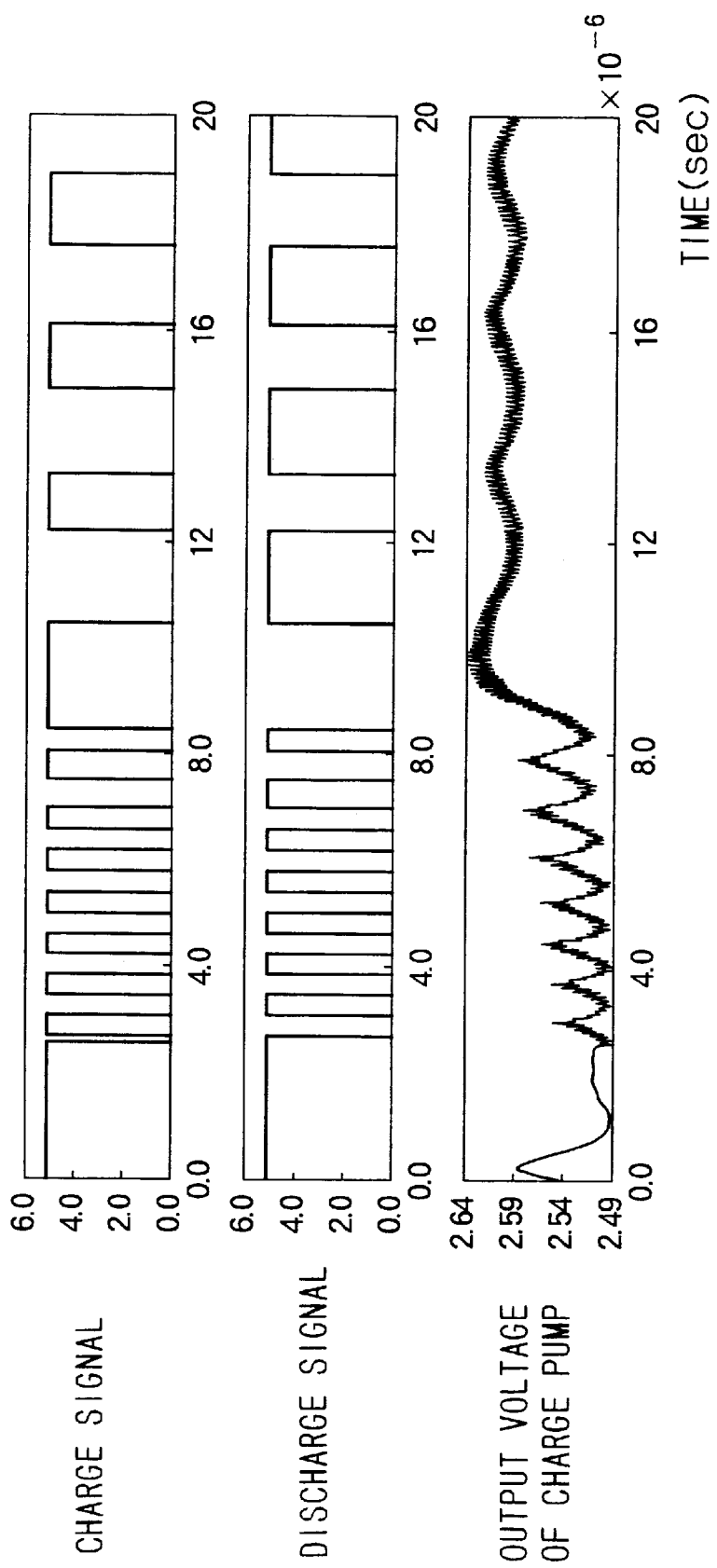
FIG. 16 is a graph showing the simulation results of the charge signal, the discharge signal, and the charge pump output voltage in the PLL when the frequency of the reference clock is lower than that of the reproduction data.

FIGS. 15 and 16 show the simulation results of the PLL according to the third embodiment. If the frequency of the reference clock is higher than that of the reproduction data, charge and discharge signals like the ones shown in FIG. 15 are generated to gradually stabilize the output voltage of the charge pump 116 at a predetermined value. If the frequency of the reference clock is lower than that of the reproduction data, charge and discharge signals like the ones shown in FIG. 16 are generated to gradually stabilize the output voltage of the charge pump 116 at a predetermined value, and lock the PLL.

Figure 17:
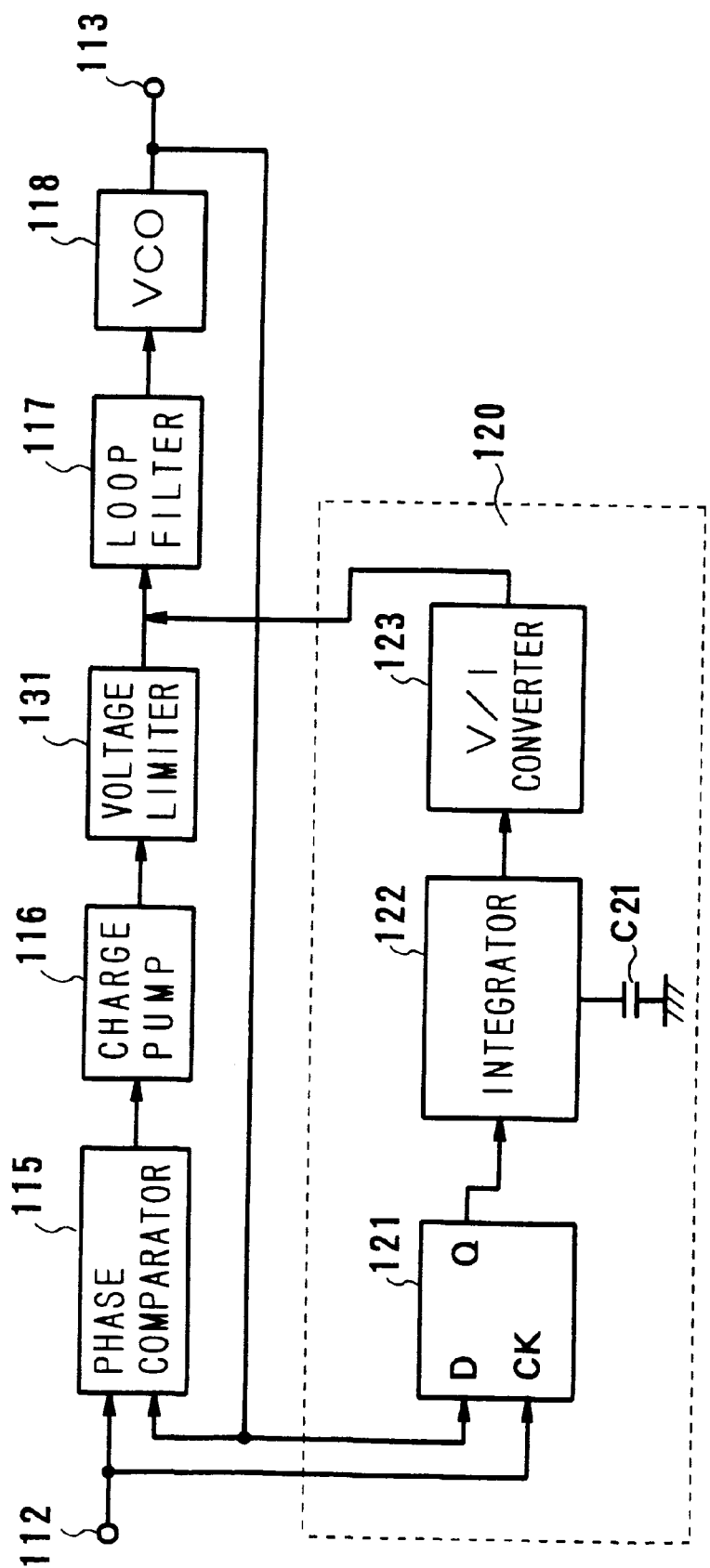
FIG. 17 is a block diagram showing the arrangement of a PLL according to the fourth embodiment of the present invention.

FIG. 17 shows the arrangement of a PLL according to the fourth embodiment of the present invention. The PLL of the fourth embodiment is obtained by eliminating the second loop from the PLL in the third embodiment. More specifically, the PLL of the fourth embodiment is prepared by eliminating the input terminal 111, the frequency comparator 114, and the selector 119 from the circuit shown in FIG. 12. While no reproduction data is input via an input terminal 112, the PLL does not perform any feedback control. While reproduction data is input, the PLL operates to make a reproduction clock phase-lock with the reproduction data by using the first loop and a frequency direction detecting section 120.

Figure 18:
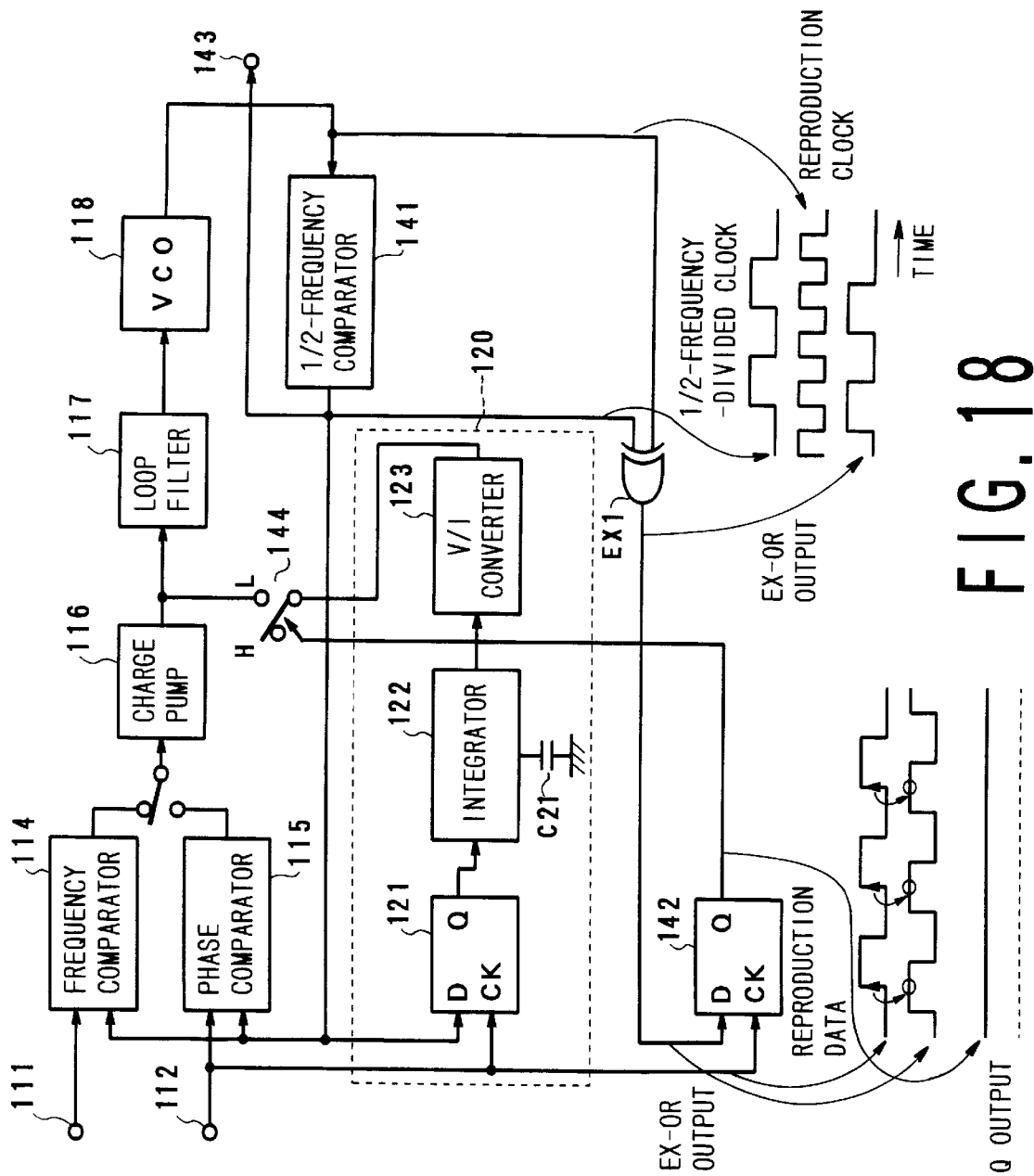
FIG. 18 is a block diagram showing the arrangement of a PLL according to the fifth embodiment of the present invention.

In the fourth embodiment, in place of omitting the second loop, an output from a charge pump 116 is supplied to a voltage limiter 131 to limit the output within a predetermined value, and the limited output is supplied to a loop filter 117. This arrangement prevents the frequency of the reproduction clock from being greatly different from that of the reproduction data without the first loop. FIG. 18 shows the arrangement of a PLL according to the fifth embodiment of the present invention. The PLL of the fifth embodiment is obtained by adding, to the PLL according to the third embodiment shown in FIG. 12, a ½-frequency divider 141 for dividing the frequency of a reproduction clock from a VCO 118 into two, an EX-OR circuit EX1 for receiving the reproduction clock and the ½-frequency-divided reproduction clock, a D flip-flop 142 for receiving an output from the EX-OR circuit EX1 at a data terminal D and reproduction data at a clock terminal CK, and generating an output Q, and a selector 144 for connecting or disconnecting the output terminal of a frequency direction detecting section 120 and the input terminal of a loop filter 117 on the basis of the output Q from the D flip-flop 142.

When the EX-OR circuit EX1 receives the reproduction clock output from the VCO 118 and the ½-frequency-divided clock, it outputs a clock obtained by shifting the phase of the reproduction clock by 90°, as shown in FIG. 18. When the output from the EX-OR circuit EX1 is input to the data terminal D of the D flip-flop 142, and the reproduction data is input to the clock terminal CK, the output level of the EX-OR circuit EX1 at the leading edge of the reproduction data is output as the output Q from the flip-flop 142. While the reproduction clock is phase-locked with the reproduction data, the output Q from the flip-flop 142 keeps high level, and the selector 144 disconnects the output terminal of the frequency direction detecting section 120 from the input terminal of the loop filter 117. Accordingly, the operation of widening the frequency pull-in range by the frequency direction detecting section 120 stops to reduce jitters. When no reproduction clock is phase-locked with the reproduction data, the output Q from the flip-flop 142 changes to low level. This output Q is supplied to the selector 144 to connect the output terminal of the frequency direction detecting section 120 to the input terminal of the loop filter 117. Consequently, the frequency pull-in range is widened, as in the third embodiment.

Figure 19:
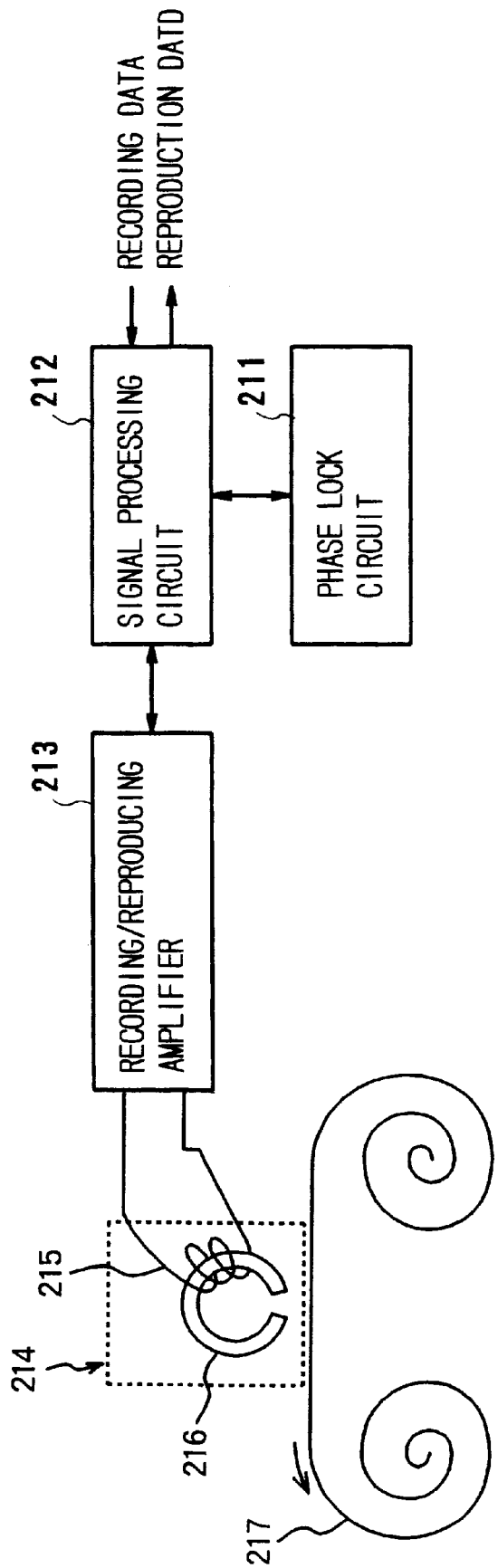
FIG. 19 is a block diagram showing the arrangement of a recording/reproducing apparatus according to the sixth embodiment of the present invention.
Figure 20:
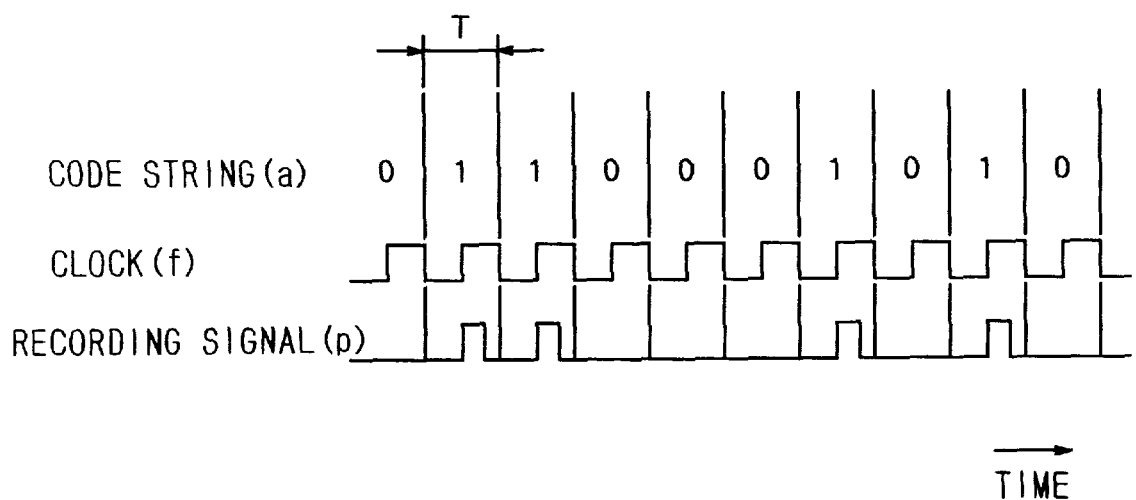
FIG. 20 is a timing chart showing the waveforms of a code string, a clock, and a recording signal in the recording/reproducing apparatus.

A recording/reproducing apparatus according to the sixth embodiment of the present invention has an arrangement shown in FIG. 19. This apparatus employs the phase-locked loop circuit according to one of the first to fifth embodiments. For example, a recording medium 217 such as a magnetic tape travels in the direction of an arrow. The recording medium 217 travels while a magnetic head 214 is brought into contact with the surface of the recording medium 217. The magnetic head 214 is a recording/reproducing head, and prepared by winding a coil 215 on an iron core 216. In recording, data is recorded on the recording medium 217 by flowing a recording current through the coil 215 of the magnetic head 214. In reproduction, data recorded on the recording medium 217 is read and reproduced by the magnetic head 214.

A recording/reproducing amplifier 213 connected to the magnetic head 214 flows the recording current through the magnetic head 214 in recording, and amplifies a small signal reproduced by the magnetic head 214 to output a reproduction signal in reproduction. In recording, a signal processing circuit 212 connected to the recording/reproducing amplifier 213 externally receives recording data to perform processing such as modulation, and outputs the recording current to the recording/reproducing amplifier 213. In reproduction, the signal processing circuit 212 receives the reproduction signal output from the recording/reproducing amplifier 213, and shapes and processes the waveform of this signal by a filter or the like to output reproduction data. At this time, the signal processing circuit 212 receives a reproduction clock output from a phase-locked loop circuit 211, and extracts reproduction data using this reproduction clock. The phase-locked loop circuit 211 receives the reproduction data output from the signal processing circuit 212 to generate a phase-locked generation clock, and output it to the signal processing circuit 212.

In the recording/reproducing apparatus according to the sixth embodiment, by employing the PLL according to one of the first to fifth embodiments, a reproduction clock phase-locked with reproduction data can be generated to increase the reliability of the apparatus even when reproduction data is omitted due to a defect of the recording medium 217 or the like.

What is claimed is:

1. A phase-locked loop circuit comprising:

a phase comparator for receiving reproduction data and a reproduction clock and comparing a phase of the reproduction data with a phase of the reproduction clock to output a phase comparison result as a first voltage signal;

a first charge pump for receiving the first voltage signal output from said phase comparator and converting the first voltage signal into a first current signal to output the first current signal;

a frequency comparator for receiving a reference clock and the reproduction clock and comparing a frequency of the reference clock with a frequency of the reproduction clock to output a frequency difference;

a frequency difference comparator for comparing the frequency difference output from said frequency comparator with a predetermined value, and outputting a second voltage signal which has a first value when the frequency difference is larger than the predetermined value, and a second value when the frequency difference is not more than the predetermined value;

a second charge pump for receiving the second voltage signal output from said frequency difference comparator, and converting the second voltage signal into a second current signal to output the second current signal;

an adder for receiving the first current signal output from said first charge pump and the second current signal output from said second charge pump, and adding the first current signal and the second current signal to output a third current signal;

a loop filter for receiving the third current signal output from said adder to output a low-frequency voltage signal; and a voltage-controlled oscillator for receiving the low-frequency voltage signal output from said loop filter to output the reproduction clock having a frequency corresponding to the low-frequency voltage signal.

2. A recording/reproducing apparatus comprising:

a phase comparator for receiving reproduction data and a reproduction clock and comparing a phase of the reproduction data with a phase of the reproduction clock to output a phase comparison result as a first voltage signal;

a first charge pump for receiving the first voltage signal output from said phase comparator and converting the first voltage signal into a first current signal to output the first current signal;

a frequency comparator for receiving a reference clock and the reproduction clock and comparing a frequency of the reference clock with a frequency of the reproduction clock to output a frequency difference;

a frequency difference comparator for comparing the frequency difference output from said frequency comparator with a predetermined value, and outputting a second voltage signal which has a first value when the frequency difference is larger than the predetermined value, and a second value when the frequency difference is not more than the predetermined value;

a second charge pump for receiving the second voltage signal output from said frequency difference comparator, and converting the second voltage signal into a second current signal to output the second current signal, an adder for receiving the first current signal output from said first charge pump and the second current signal output from said second charge pump, and adding the first current signal and the second current signal to output a third current signal;

a loop filter for receiving the third current signal output from said adder to output a low-frequency voltage signal;

a voltage-controlled oscillator for receiving the low-frequency voltage signal output from said loop filter to output the reproduction clock having a frequency corresponding to the low-frequency voltage signal;

a magnetic head for reading data recorded on a surface of a recording medium to output a reproduction signal;

a reproducing amplifier for receiving and amplifying the reproduction signal output from said magnetic head to output an amplified signal; and a signal processing circuit for receiving the amplified signal output from said reproducing amplifier and the reproduction clock output from said phase-locked loop circuit, and extracting the reproduction data from the amplified signal using the reproduction clock to output the reproduction data to said phase-locked loop circuit.

* * * * *